(12) United States Patent
Izumi et al.

(10) Patent No.: US 11,936,227 B2
(45) Date of Patent: Mar. 19, 2024

(54) POWER SUPPLY SYSTEM AND ENERGY MANAGEMENT METHOD

(71) Applicant: TOYOTA JIDOSHA KABUSHIKI KAISHA, Toyota (JP)

(72) Inventors: Junta Izumi, Nagoya (JP); Kenji Kimura, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 11 days.

(21) Appl. No.: 17/749,794

(22) Filed: May 20, 2022

(65) Prior Publication Data
US 2023/0060273 A1 Mar. 2, 2023

(30) Foreign Application Priority Data

Aug. 24, 2021 (JP) ................................. 2021-136206

(51) Int. Cl.
*H02J 7/00* (2006.01)
*H01M 10/42* (2006.01)
*H01M 10/44* (2006.01)
*H01M 10/48* (2006.01)

(52) U.S. Cl.
CPC .......... *H02J 7/007* (2013.01); *H01M 10/425* (2013.01); *H01M 10/441* (2013.01); *H01M 10/482* (2013.01); *H02J 7/0013* (2013.01); *H02J 7/005* (2020.01); *H01M 2010/4271* (2013.01); *H02J 2207/20* (2020.01)

(58) Field of Classification Search
CPC ............. H01M 10/482; H01M 10/441; H01M 2010/4271; H01M 10/425; Y04S 20/222; Y04S 20/221; Y04S 10/14; Y04S 50/10; Y04S 50/16; H02J 2207/20; H02J 3/32; H02J 7/0013; H02J 7/0016; H02J 7/007; H02J 7/0021; H02J 7/0024; H02J 7/005; H02J 7/0047; H02J 7/0063; H02J 3/14; H02J 7/00712; H02J 7/007194; H02J 7/34; H02J 7/342; H02J 7/0025; Y02E 60/10; G01R 31/392; G01R 31/396; Y02B 70/3225; H02M 7/483

See application file for complete search history.

(56) References Cited

U.S. PATENT DOCUMENTS

| | | | |
|---|---|---|---|
| 11,011,982 B2 | 5/2021 | Goto et al. | |
| 11,424,620 B2 * | 8/2022 | Juang | H02J 7/007 |
| 2011/0254373 A1 * | 10/2011 | Johnson | H02M 7/483 |
| | | | 307/77 |
| 2017/0063108 A1 | 3/2017 | Wang et al. | |
| 2020/0244076 A1 | 7/2020 | Wang et al. | |
| 2022/0190395 A1 * | 6/2022 | Namuduri | H02J 7/0048 |

FOREIGN PATENT DOCUMENTS

| | | | |
|---|---|---|---|
| BE | 1022874 B1 * | 9/2016 | |
| JP | 2018-074709 A | 5/2018 | |
| KR | 20160028341 A * | 3/2016 | |
| WO | 2018/079664 A1 | 5/2018 | |

* cited by examiner

*Primary Examiner* — Ryan Johnson
(74) *Attorney, Agent, or Firm* — Oliff PLC

(57) ABSTRACT

In a power supply system, a control device is configured to select one or more target batteries that are to perform requested energy management from a plurality of batteries included in an alternating-current battery string and a direct-current battery string, and perform the requested energy management using the one or more target batteries with the batteries other than the one or more target batteries being disconnected from a circuit.

12 Claims, 15 Drawing Sheets

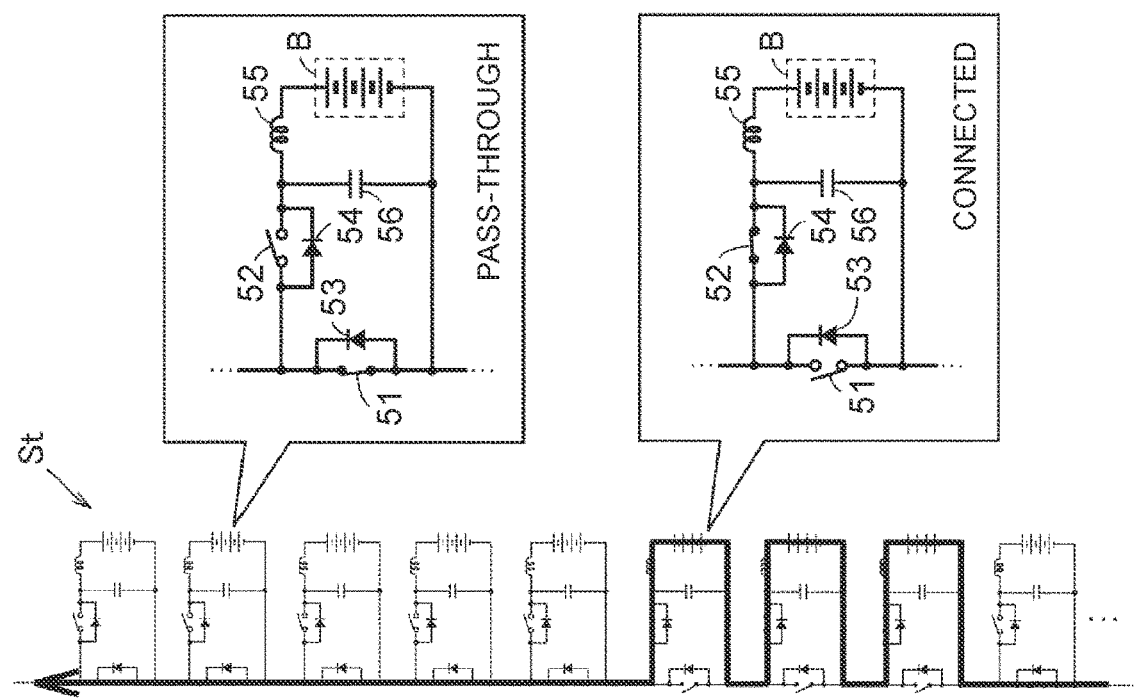
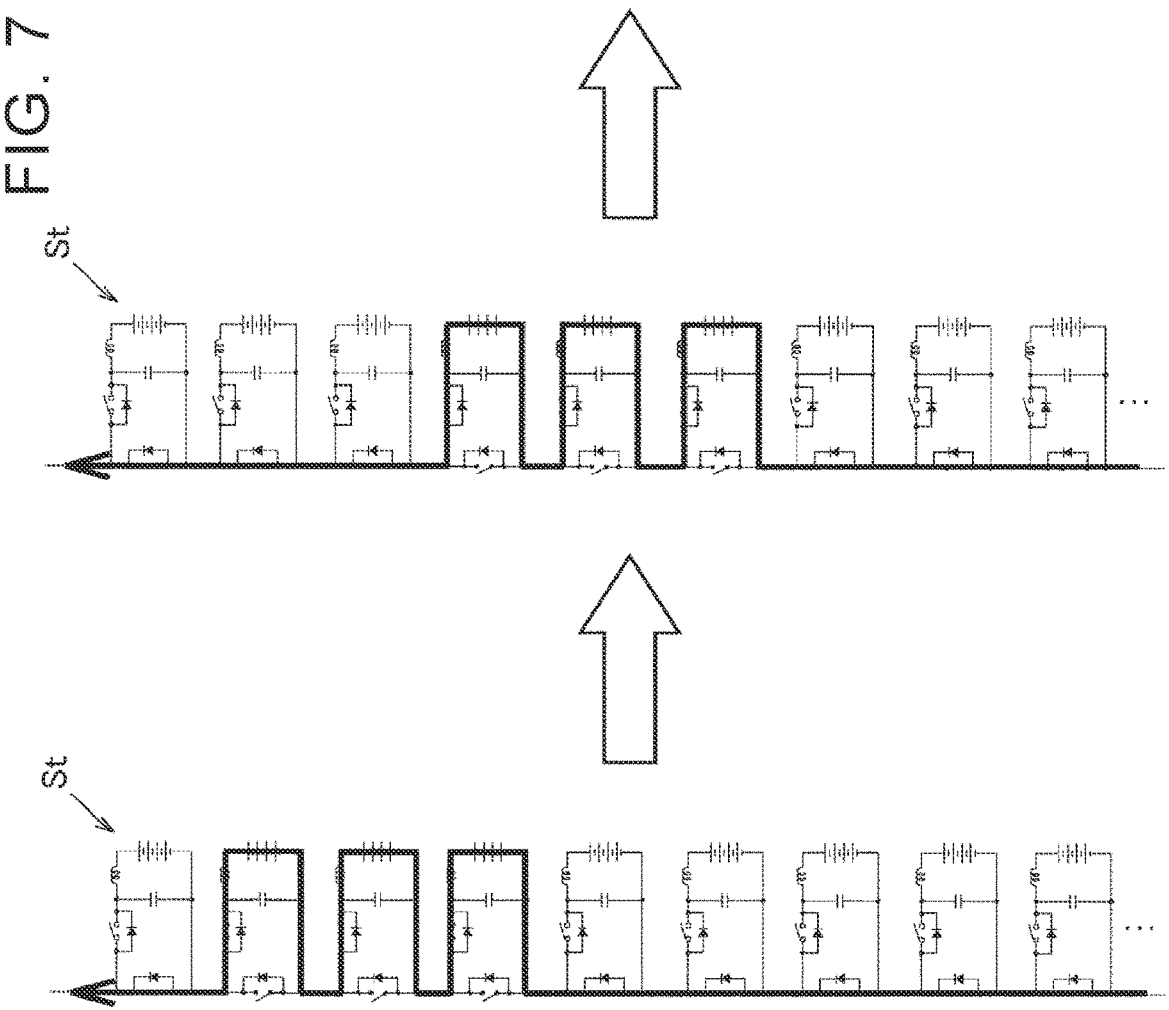
FIG. 7

FIG. 12

KINDS AND CONTENTS OF POWER ADJUSTMENT

| CONTROL RESERVE | PRIMARY CONTROL RESERVE | SECONDARY CONTROL RESERVE | | TERTIARY CONTROL RESERVE | |
|---|---|---|---|---|---|
| | FCR | S-FRR | FRR | RR | RR-FIT |
| COMMAND CONTROL | LOCAL CONTROL (OFFLINE) | LFC SIGNAL | EDC SIGNAL | EDC SIGNAL | ONLINE |
| COMMAND INTERVALS | – | 0.5 SECONDS TO SEVERAL TENDS OF SECONDS | ONE TO SEVERAL MINUTES | ONE TO SEVERAL MINUTES | 30 MINUTES |
| RESPONSE TIME | WITHIN 10 SECONDS | WITHIN 5 MINUTES | WITHIN 5 MINUTES | WITHIN 15 MINUTES | WITHIN 45 MINUTES |
| DURATION TIME | 5 MINUTES | 30 MINUTES | 30 MINUTES | 3 HOURS | 3 HOURS |

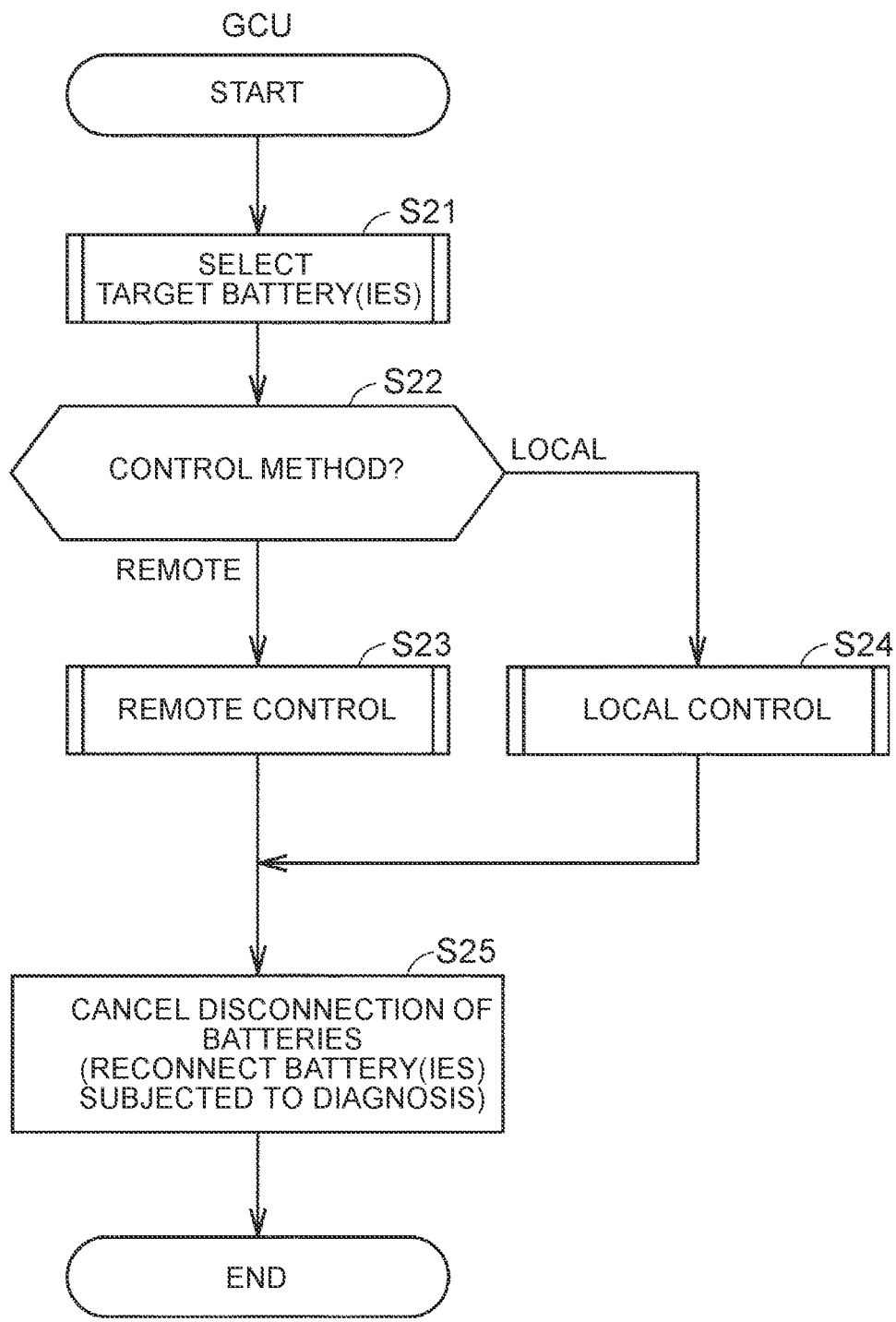

POWER SUPPLY SYSTEM AND ENERGY MANAGEMENT METHOD

CROSS-REFERENCE TO RELATED APPLICATION

This application claims priority to Japanese Patent Application No. 2021-136206 filed on Aug. 24, 2021, incorporated herein by reference in its entirety.

BACKGROUND

1. Technical Field

The present disclosure relates to power supply systems and energy management methods, and more particularly to a power supply system and energy management method using a battery string.

2. Description of Related Art

Japanese Unexamined Patent Application Publication No. 2018-074709 (JP 2018-074709 A) discloses a control circuit for controlling a battery string. The battery string includes multiple battery circuit modules connected to each other. Each battery circuit module included in the battery string includes: a battery; a first switch connected in parallel with the battery; a second switch connected in series with the battery; and a first output terminal and a second output terminal to which the voltage of the battery is applied when the first switch is in the OFF state and the second switch is in the ON state. The control circuit can adjust the output voltage of the battery string to a desired magnitude by controlling the first and second switches of each battery circuit module included in the battery string.

SUMMARY

JP 2018-074709 A discloses a power supply system that outputs direct-current (DC) power using such a battery string. However, JP 2018-074709 A does not at all consider outputting a power waveform (alternating-current (AC) power) using the battery string. JP 2018-074709 A does not at all consider performing energy management using the battery string.

The present disclosure provides a power supply system and energy management method that can suitably perform energy management using a battery string.

A power supply system according to a first aspect of the present disclosure includes a first power supply circuit, a second power supply circuit, and a control device. The first power supply circuit includes a direct-current battery string for direct-current power and an inverter that converts direct-current power output from the direct-current battery string to alternating-current power, and the first power supply circuit is configured to output first alternating-current power with use of the direct-current battery string and the inverter. The second power supply circuit includes an alternating-current battery string for alternating-current power, and is configured to output second alternating-current power with use of the alternating-current battery string. The control device is configured to control the first power supply circuit and the second power supply circuit. Each of the alternating-current battery string and the direct-current battery string includes multiple battery circuit modules connected in series. Each of the battery circuit modules includes a battery, an output terminal that outputs a voltage of the battery, a first switch connected to the output terminal and connected in parallel with the battery, and a second switch connected in series with the battery. Each of the battery circuit modules is configured such that the voltage of the battery is applied to the output terminal when the first switch is in an electrically disconnected state and the second switch is in an electrically connected state. The control device is configured to select one or more target batteries that are to perform requested energy management from the batteries included in the alternating-current battery string and the direct-current battery string, and perform the requested energy management using the one or more target batteries with the batteries other than the one or more target batteries being disconnected from a circuit.

The above power supply system selects the one or more target batteries that meet an energy management requirement from the batteries included in the battery strings, and causes the one or more target batteries to perform the energy management with the batteries other than the one or more target batteries being disconnected from the circuit. With the above configuration, the power supply system can suitably perform the energy management using the one or more target batteries while maintaining the state of the batteries that do not perform the energy management (batteries included in the battery strings other than the one or more target batteries).

Moreover, the above power supply system can easily output various kinds of alternating-current power using the first power supply circuit and the second power supply circuit. Specifically, the first power supply circuit can generate a power waveform (alternating-current power) from the direct-current power output from the direct-current battery string using the inverter. The second power supply circuit can adjust the number of batteries connected to the circuit by controlling the first switch and the second switch of each battery circuit module included in the alternating-current battery string. Different kinds of batteries (e.g., high capacity batteries and high power batteries) can be used for the alternating-current battery string and the direct-current battery string. The above configuration therefore makes it easier to increase the range of the voltage (V) that can be output and the range of power (kW) that can be output and to increase the time during which power can be output. As described above, the above power supply system has a configuration that easily respond to various energy management requests.

In the above power supply system, the control device may be configured to perform a degradation diagnosis on each of one or more of the batteries included in the alternating-current battery string and one or more of the batteries included in the direct-current battery string using data continuously acquired during at least one of charging and discharging of the battery. The control device may be configured to determine whether power fluctuations in the requested energy management are acceptable for the degradation diagnosis. The control device may be configured to exclude, from one or more candidate target batteries, one or more batteries that are being subjected to the degradation diagnosis among the batteries included in the alternating-current battery string and the direct-current battery string, when the control device determines that the power fluctuations in the requested energy management are not acceptable for the degradation diagnosis.

In the above power supply system, the control device performs the degradation diagnosis on the battery using the data continuously acquired during at least one of charging and discharging of the battery (e.g., using changes in battery voltage and/or battery current). If a battery that is being subjected to the degradation diagnosis participates in energy management involving large power fluctuations that make it impossible to acquire appropriate data while the degradation diagnosis is being performed, the degradation diagnosis needs to be started over (i.e., needs to be restarted from the beginning). In the above power supply system, when the power fluctuations in the energy management are not acceptable for the degradation diagnosis, the one or more batteries that are being subjected to the degradation diagnosis are not allowed to participate in the energy management. This reduces the possibility that the degradation diagnosis may be started over. The one or more batteries that are being subjected to the degradation diagnosis are disconnected from the circuit during the degradation diagnosis, and the state of the one or more batteries is maintained while the energy management is being performed. The control device can resume the interrupted degradation diagnosis after the energy management ends.

The control device may perform the degradation diagnosis on all the batteries included in the battery strings, or may perform the degradation diagnosis only on a predetermined number of batteries included in the battery strings as representative batteries.

The control device may be configured to determine that the power fluctuations in the requested energy management are acceptable for the degradation diagnosis when a duration time of the requested energy management is equal to or greater than a first reference value.

Power fluctuations tend to be small in energy management when the duration time of the energy management is long. With the above configuration, whether the power fluctuations in the requested energy management are acceptable for the degradation diagnosis can be easily and accurately determined.

The control device may be configured to determine that the power fluctuations in the requested energy management are not acceptable for the degradation diagnosis when a response time of the requested energy management is equal to or less than a second reference value.

Power fluctuations tend to be large in energy management when the response time of the energy management is short. With the above configuration, whether the power fluctuations in the requested energy management are acceptable for the degradation diagnosis can be easily and accurately determined.

A power density of each of the batteries included in the direct-current battery string may be higher than a power density of each of the batteries included in the alternating-current battery string. An energy density of each of the batteries included in the alternating-current battery string may be higher than an energy density of each of the batteries included in the direct-current battery string.

With the above configuration, various kinds of alternating-current power can be more easily output using the first power supply circuit and the second power supply circuit. For example, long-term power supply can be more easily performed using high capacity batteries (batteries with high energy density). High-rate power supply can be more easily performed using high power batteries (batteries with high power density).

Hereinafter, each battery included in the direct-current battery string is also referred to as "direct-current battery (DC battery)." The power density of each of the direct-current batteries may be 1000 W/kg or more, 1500 W/kg or more and less than 5000 W/kg, or 5000 W/kg or more. The energy density of each of the direct-current batteries may be less than 300 Wh/kg, less than 100 Wh/kg, or 50 Wh/kg or more and less than 500 Wh/kg.

Hereinafter, each battery included in the alternating-current battery string is also referred to as "alternating-current battery (AC battery)." The energy density of each of the alternating-current batteries may be 300 Wh/kg or more, 500 Wh/kg or more and less than 1000 Wh/kg, or 1000 Wh/kg or more. The power density of each of the alternating-current batteries may be less than 1000 W/kg, or 300 W/kg or more and less than 1000 W/kg.

In any of the power supply systems described above, each of the first power supply circuit and the second power supply circuit may be electrically connected to an electrical wire connecting a building and an external power supply that supplies power to the building. The requested energy management may be adjustment of power of the external power supply.

With the above configuration, alternating-current power can be supplied to the building from each of the first power supply circuit and the second power supply circuit. Since each of the alternating-current batteries and the direct-current batteries can be charged with the power from the external power supply, each of the first power supply circuit and the second power supply circuit can store power as necessary. The power supply system may function as an emergency power source for the building. The external power supply may be a power grid.

Any of the power supply systems described above may further include an insulation filter located between the first power supply circuit and the electrical wire. The inverter may be a reused product that was used for another purpose.

In a mode in which the inverter is a reused product, a desired alternating-current power waveform is not always obtained by the inverter. In the above configuration, the insulation filter is therefore provided between the first power supply circuit and the electrical wire. The use of the insulation filter makes it easier to obtain a desired alternating-current power waveform and to reduce noise contained in output (alternating-current power) of the first power supply circuit.

For example, a reused product that was used as an inverter for traveling in an electrified vehicle (xEV) (that is, an inverter removed from an xEV after use) can be used as the inverter. The inverter for traveling is, for example, an inverter that drives a motor for traveling in an xEV (i.e., a motor for causing an xEV to travel). Electrified vehicles (xEVs) are vehicles that use electric power as all or part of a power source. Electrified vehicles (xEVs) include battery electric vehicles (BEVs), plug-in hybrid electric vehicles (PHEVs), and fuel cell electric vehicles (FCEVs).

The first power supply circuit may include a first drive circuit configured to drive the first switch and the second switch included in the direct-current battery string, and a first control circuit configured to send a signal for driving each of the first switch and the second switch to the first drive circuit according to a command from the control device. The second power supply circuit may include a second drive circuit configured to drive the first switch and the second switch included in the alternating-current battery string, and a second control circuit configured to send a signal for driving each of the first switch and the second switch to the second drive circuit according to a command from the control device.

With the above configuration, the alternating-current battery string and the direct-current battery string can be more easily suitably controlled by the first control circuit and the second control circuit.

In the above power supply system, the inverter may be a three-phase inverter. The control device may be configured to send a command for controlling the direct-current battery string to the first control circuit and control the inverter such that three-phase alternating-current power is output from the first power supply circuit. The alternating-current battery string may include a U-phase battery string, a V-phase battery string, and a W-phase battery string that are Y-connected. The control device may be configured to send a command for controlling the U-phase battery string, the V-phase battery string, and the W-phase battery string to the second control circuit such that three-phase alternating-current power is output from the second power supply circuit.

With the above configuration, the three-phase alternating-current power can be output from each of the first power supply circuit and the second power supply circuit. The voltage of the three-phase alternating-current power may be 190 V or more and 300 V or less, or may be 200 V.

A power supply system according to a second aspect of the present disclosure includes a battery string and a control device configured to control the battery string. The battery string includes multiple battery circuit modules connected in series. Each of the battery circuit modules includes a battery, an output terminal that outputs a voltage of the battery, a first switch connected to the output terminal and connected in parallel with the battery, and a second switch connected in series with the battery. Each of the battery circuit modules is configured such that the voltage of the battery is applied to the output terminal when the first switch is in an electrically disconnected state and the second switch is in an electrically connected state. The control device is configured to select one or more target batteries that match requested energy management from the batteries included in the battery string, and perform the requested energy management using the one or more target batteries with the batteries other than the one or more target batteries being disconnected from a circuit. The control device is configured to perform a degradation diagnosis on each of the batteries included in the battery string using data continuously acquired during at least one of charging and discharging of the battery. The control device is configured to determine whether power fluctuations in the requested energy management are acceptable for the degradation diagnosis. The control device is configured to exclude, from one or more candidate target batteries, one or more batteries that are being subjected to the degradation diagnosis among the batteries included in the battery string, when the control device determines that the power fluctuations in the requested energy management are not acceptable for the degradation diagnosis.

Like the power supply system according to the first aspect of the present disclosure, the power supply system according to the second aspect of the present disclosure can also suitably perform the energy management using the one or more target batteries while maintaining the state of the batteries that do not perform the energy management (batteries included in the battery string other than the one or more target batteries). The power supply system with the above configuration reduces the possibility that the degradation diagnosis may be started over.

An energy management method according to a third aspect of the present disclosure is a method for performing energy management using a battery string. The battery string includes multiple battery circuit modules connected in series. Each of the battery circuit modules includes a battery, an output terminal that outputs a voltage of the battery, a first switch connected to the output terminal and connected in parallel with the battery, and a second switch connected in series with the battery. Each of the battery circuit modules is configured such that the voltage of the battery is applied to the output terminal when the first switch is in an electrically disconnected state and the second switch is in an electrically connected state. The method includes determining whether power fluctuations in requested energy management are large; when a determination is made that the power fluctuations in the requested energy management are not large, selecting the batteries included in the battery string as candidate target batteries, and when a determination is made that the power fluctuations in the requested energy management are large, selecting the batteries included in the battery string other than one or more batteries that are subjected to a degradation diagnosis, as the candidate target batteries; selecting one or more target batteries from the candidate target batteries; controlling the first and second switches so as to disconnect, from a circuit, the batteries included in the battery string other than the one or more target batteries; and performing the requested energy management using the one or more target batteries, with the batteries other than the one or more target batteries being disconnected from the circuit.

Like the power supply system according to the second aspect of the present disclosure, in the energy management method according to the third aspect of the present disclosure as well, the energy management can be suitably performed using the one or more target batteries while maintaining the state of the batteries that do not perform the energy management. Since the state of the one or more batteries that are being subjected to the degradation diagnosis is maintained, the possibility that the degradation diagnosis may be started over can be reduced.

According to the above aspects of the present disclosure, it is possible to provide the power supply system and energy management method capable of suitably performing energy management using the battery string.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 7 illustrates an example of sweep control that is performed in the sweep unit shown in FIG. 2;

FIG. 12 shows an example of the kinds and contents of energy management;

FIG. 13 is a flowchart showing an example of a process related to energy management that is performed by the GCU (control device) shown in FIG. 1;

DETAILED DESCRIPTION OF EMBODIMENTS

Hereinafter, an embodiment of the present disclosure will be described in detail with reference to the drawings. The same or corresponding portions are denoted by the same signs throughout the drawings, and description thereof will not be repeated. Hereinafter, a string control unit is referred to as "SCU." A group control unit is referred to as "GCU." An alternating-current is sometimes referred to as "AC," and a direct-current is sometimes referred to as "DC."

Figure 1:
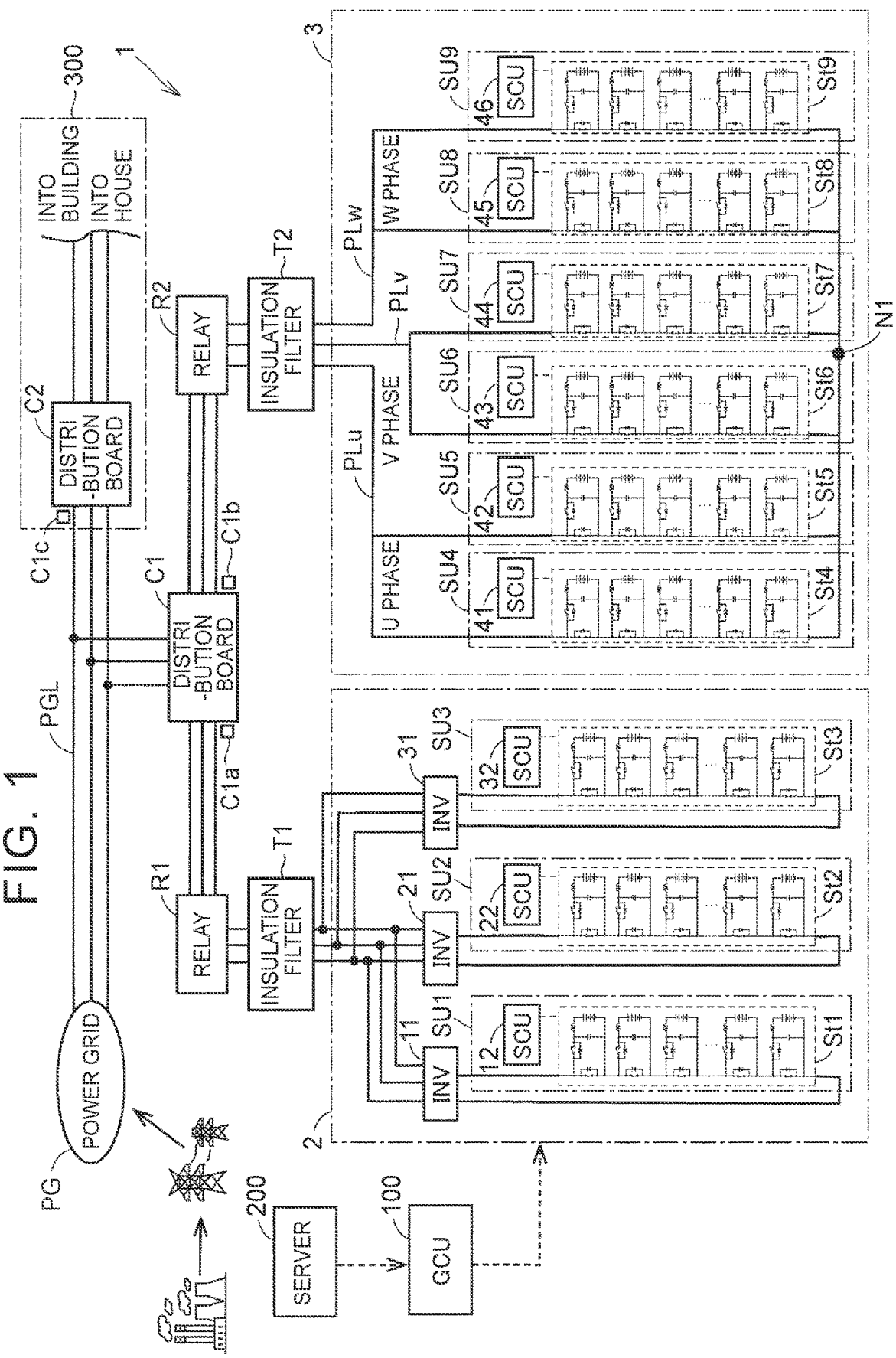
FIG. 1 shows a configuration of a power supply system according to an embodiment of the present disclosure.

FIG. 1 shows a configuration of a power supply system according to the embodiment. A power supply system 1 includes a first power supply circuit 2, a second power supply circuit 3, insulation filters T1, T2, relays R1, R2, a distribution board C1, and a GCU 100. The GCU 100 is an example of the "control device" according to the present disclosure. The GCU 100 may be a computer. The GCU 100 includes, for example, a processor, a random access memory (RAM), and a storage device (none of which are shown). The GCU 100 performs various processes by the processor executing programs stored in the storage device. However, the various processes of the GCU 100 need not necessarily be performed by software, and may be performed by dedicated hardware (electronic circuit). In the present embodiment, the power supply system 1 is applied to a building 300 such as a house, school, hospital, commercial facility, or train station.

A power grid (i.e., an electrical power grid) PG supplies electric power to the building 300 through electrical wires PGL. The power grid PG is a power network constituted by power transmission and distribution equipment. A plurality of power plants is connected to the power grid PG. Electric power is supplied from the power plants to the power grid PG. In the present embodiment, an electric power company maintains and manages the power grid PG (commercial power supply). The electric power company corresponds to a transmission system operator (TSO) (grid operator). The power grid PG supplies three-phase AC power to the building 300. The power grid PG is an example of the "external power source" according to the present disclosure. A server 200 manages the supply and demand situation of the power grid PG. The server 200 is configured to communicate with the GCU 100. In the present embodiment, the server 200 belongs to the electric power company. However, the present disclosure is not limited to this, and the server 200 may be a server that belongs to an aggregator, or may be a server that trades electricity in an electric power market (e.g., a supply and demand adjustment market, i.e., an electricity balancing market).

Each of the first power supply circuit 2 and the second power supply circuit 3 is configured to supply and receive electric power to and from the power grid PG. Each of the first power supply circuit 2 and the second power supply circuit 3 sometimes receives electric power from the power grid PG and sometimes supplies electric power to the power grid PG. Each of the first power supply circuit 2 and the second power supply circuit 3 is electrically connected to the electrical wires PGL (electrical wires connecting the power grid PG and the building 300) via the distribution board C1. The relay R1 and the insulation filter T1 are provided between the electrical wires PGL and the first power supply circuit 2 (more specifically, between the distribution board C1 and the first power supply circuit 2). The relay R2 and the insulation filter T2 are provided between the electrical wires PGL and the second power supply circuit 3 (more specifically, between the distribution board C1 and the second power supply circuit 3).

The distribution board C1 includes an earth leakage circuit breaker and/or a breaker. The distribution board C1 is provided with power sensors C1a, C1b. The power sensor C1a includes a current sensor that detects a current (input and output current) flowing between the first power supply circuit 2 and the electrical wires PGL, and a voltage sensor that detects an input and output voltage of the first power supply circuit 2. The power sensor C1b includes a current sensor that detects a current (input and output current) flowing between the second power supply circuit 3 and the electrical wires PGL, and a voltage sensor that detects an input and output voltage of the second power supply circuit 3. The power sensors C1a, C1b output their detection results to the GCU 100. The distribution board C1 may further include an electricity meter (not shown).

A distribution board C2 installed in the building 300 is configured to receive electric power supplied from each of the power grid PG and the power supply system 1. The distribution board C2 is connected to indoor wires and distributes power supplied from either or both of the power grid PG and the power supply system 1 to the indoor wires.

The distribution board C2 is provided with a power sensor C1c. The power sensor C1c includes a current sensor that detects a current flowing through the electrical wires PGL and a voltage sensor that detects a voltage applied to the electrical wires PGL. The electric power (current and voltage) detected by the power sensor C1c corresponds to the electric power (current and voltage) that is supplied from the power grid PG to the building 300. The power sensor C1c outputs its detection results to the GCU 100. The distribution board C2 may further include an electricity meter (not shown).

The first power supply circuit 2 includes battery strings St1, St2, and St3, inverters 11, 21, and 31, and SCUs 12, 22, and 32. The second power supply circuit 3 includes battery strings St4 to St9 and SCUs 41 to 46. Each battery string St in the first power supply circuit 2 and the second power supply circuit 3 forms a sweep unit SU.

Figure 2:
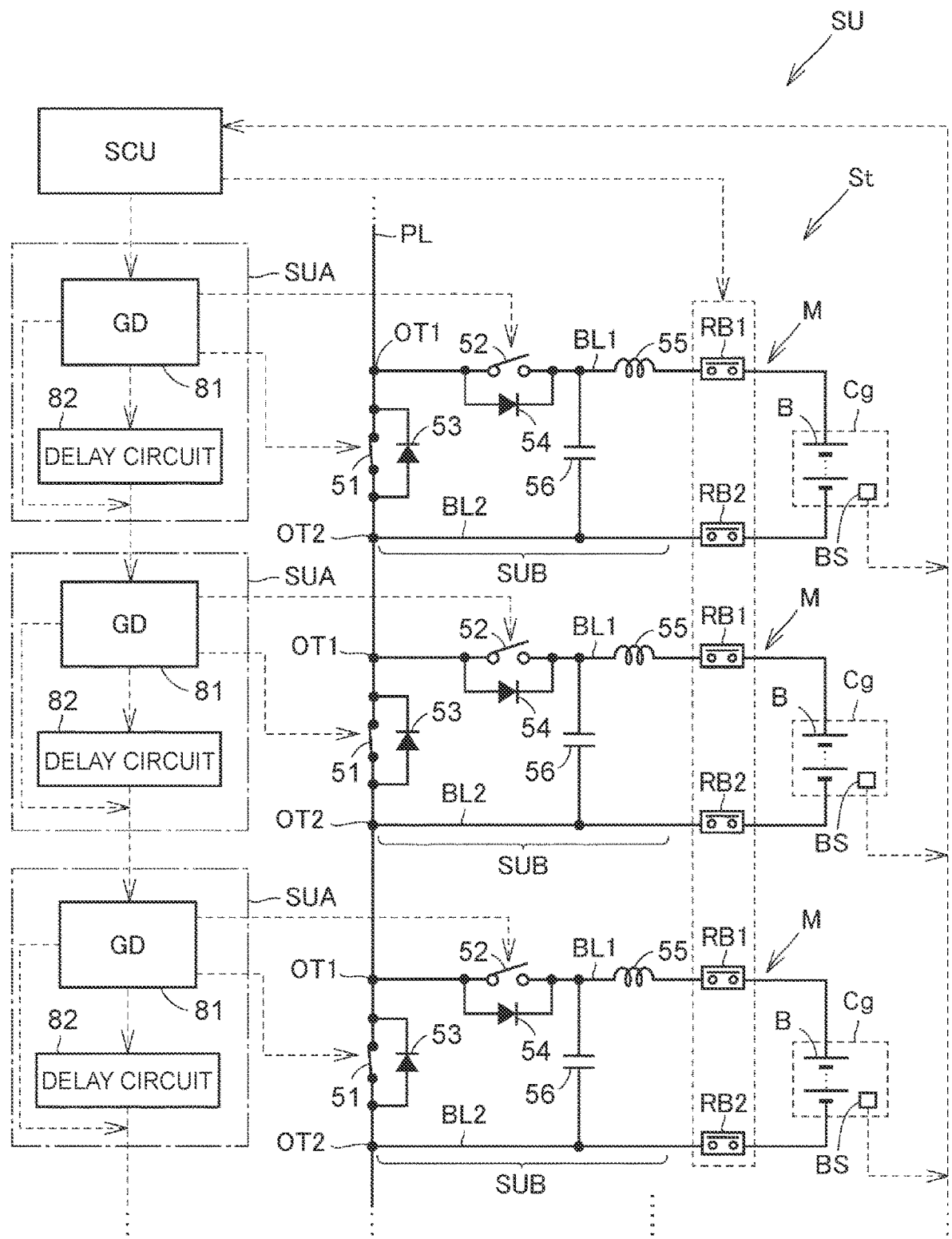
FIG. 2 shows a configuration of each sweep unit included in the power supply system shown in FIG. 1.

FIG. 2 shows a configuration of the sweep unit SU. Referring to FIG. 2 together with FIG. 1, in the power supply system 1 according to the present embodiment, the sweep units SU are mounted on each of the first power supply circuit 2 and the second power supply circuit 3. The sweep unit SU is a module including a battery string St (corresponding to the battery strings St1 to St9 shown in FIG. 1); a plurality of drive circuits SUA (not shown in FIG. 1) that drives switches (SW 51 and SW 52 that will be described later) in the battery string St; and an SCU (corresponding to the SCUs 12, 22, 32 and 41 to 46 shown in FIG. 1) that sends a control signal to the drive circuits SUA. The drive circuits SUA may be formed on one substrate and integrated. The sweep unit SU may be one circuit board.

The battery string St includes multiple battery circuit modules M connected in series. In the present embodiment, the battery string St includes about 20 battery circuit modules M. However, the battery string St may include any number of battery circuit modules M. The battery string St may include 5 to 50 battery circuit modules M, or may include 100 or more battery circuit modules M. In the present embodiment, each battery string St in the first power supply circuit 2 and the second power supply circuit 3 includes the same number of battery circuit modules M. However, the numbers of battery circuit modules M in battery strings St may be different from each other.

Each battery circuit module M includes a power circuit SUB and a cartridge Cg. The cartridge Cg includes a battery B and a monitoring unit BS. The battery circuit module M including the battery B is formed by connecting the power circuit SUB and the battery B. The drive circuit SUA is provided for each battery circuit module M. The drive circuit SUA is configured to drive the switches included in the battery circuit module M (more specifically, SW 51 and SW 52). The battery B will be described in detail later. In the present embodiment, different kinds of batteries are used for the first power supply circuit 2 and the second power supply circuit 3.

As shown in FIG. 2, each battery circuit module M further includes circuit breakers RB1, RB2 (hereinafter referred to as "circuit breakers RB" when not individually identified). The power circuit SUB and the cartridge Cg are connected to each other via the circuit breakers RB1, RB2. The SCU is configured to switch the connection state between the power circuit SUB and the cartridge Cg (i.e., switch the connection state between an electrically connected state and an electrically disconnected state) by controlling ON and OFF of each circuit breaker RB according to a control command from the GCU 100. The circuit breaker RB may be an electromagnetic mechanical relay. The circuit breaker RB may be configured to be manually turned on and off by a user.

In the present embodiment, the cartridge Cg is detachable from the power circuit SUB. For example, the user may remove the cartridge Cg from the power circuit SUB when the circuit breakers RB1, RB2 are in the OFF state (electrically disconnected state). Since the battery string St can operate even when there is an empty cartridge, the user can easily increase or decrease the number of cartridges Cg in the battery string St. The battery string St is suitable for battery reuse.

The monitoring unit BS of the cartridge Cg is configured to detect the state of the battery B (e.g., voltage, current, and temperature) and output the detection results to the SCU. The monitoring unit BS includes a voltage sensor that detects the voltage of the battery B, a current sensor that detects the current of the battery B, and a temperature sensor that detects the temperature of the battery B. The monitoring unit BS may be a battery management system (BMS) having a state of charge (SOC) estimation function, a state of health (SOH) estimation function, a battery voltage equalization function, a diagnostic function, and a communication function, in addition to the above sensor functions. The SCU acquires the state of each battery B (e.g., temperature, current, voltage, SOC, and internal resistance) based on the output of each monitoring unit BS, and outputs the acquired state of each battery B to the GCU 100. The SOC indicates the remaining capacity of the battery B. For example, the SOC is the ratio of the available capacity to the capacity in the fully charged state and varies in a range of 0% to 100%.

The battery circuit modules M included in the battery string St are connected by a common electrical wire PL. The electrical wire PL includes output terminals OT1, OT2 of each battery circuit module M. The output terminal OT2 of each battery circuit module M is connected to the output terminal OT1 of its adjacent battery circuit module M. The battery circuit modules M included in the battery string St are thus connected to each other.

The power circuit SUB includes a first switching element 51 (hereinafter referred to as "SW 51"), a second switching element 52 (hereinafter referred to as "SW 52"), a first diode 53, a second diode 54, and a choke coil 55, a capacitor 56, and output terminals OT1, OT2. Each of the SW 51 and the SW 52 is driven by the drive circuit SUA. The SW 51 and the SW 52 according to the present embodiment are an example of the "first switch" and the "second switch" according to the present disclosure, respectively.

The SW 51, the capacitor 56, and the battery B are connected in parallel between the output terminals OT1, OT2 of the power circuit SUB. The SW 51 is located on the electrical wire PL and is configured to switch the connection state between the output terminal OT1 and the output terminal OT2 (i.e., switch the connection state between the electrically connected state and the electrically disconnected state). The output terminal OT1 is connected to a positive electrode of the battery B via an electrical wire BL1, and the output terminal OT2 is connected to a negative electrode of the battery B via an electrical wire BL2. The circuit breakers RB1, RB2 are provided on the electrical wires BL1, BL2, respectively. The SW 52 and the choke coil 55 are also provided on the electrical wire BL1. In the battery circuit module M, a voltage of the battery B is applied between the output terminals OT1, OT2 when the SW 52 connected in series with the battery B is in the ON state (electrically connected state) and the SW 51 connected in parallel with the battery B is in the OFF state (electrically disconnected state).

The capacitor 56 connected to the electrical wires BL1, BL2 is provided between the battery B and the output terminals OT1, OT2. One end of the capacitor 56 is connected to the electrical wire BL1 at a position between the SW 52 and the choke coil 55. The capacitor 56 smooths the voltage of the battery B and outputs the smoothed voltage between the output terminals OT1, OT2.

Each of the SW 51 and the SW 52 is, for example, a field effect transistor (FET). The first diode 53 and the second diode 54 are connected in parallel with the SW 51 and the SW 52, respectively. The SW 52 is located between the output terminal OT1 and the choke coil 55. The choke coil 55 is located between the SW 52 and the positive electrode of the battery B. The battery B, the choke coil 55, and the capacitor 56 form an RLC filter. The RLC filter performs current leveling. Each of the SW 51 and the SW 52 is not limited to the FET and may be a switch other than the FET.

The SCU sends a signal for driving each of the SW 51 and the SW 52 to the drive circuit SUA according to a command from the GCU 100. Specifically, the SCU generates a gate signal according to a control command from the GCU 100. This gate signal corresponds to the signal for driving each of the SW 51 and the SW 52 according to a command from the GCU 100. The SCU then sends the gate signal to the drive circuit SUA. The drive circuit SUA includes a gate driver (GD) 81 that drives the SW 51 and the SW 52 according to the gate signal, and a delay circuit 82 that delays the gate signal. Each of the SW 51 and the SW 52 included in the battery circuit module M is controlled to be in the ON state or the OFF state according to the gate signal.

Figure 3:
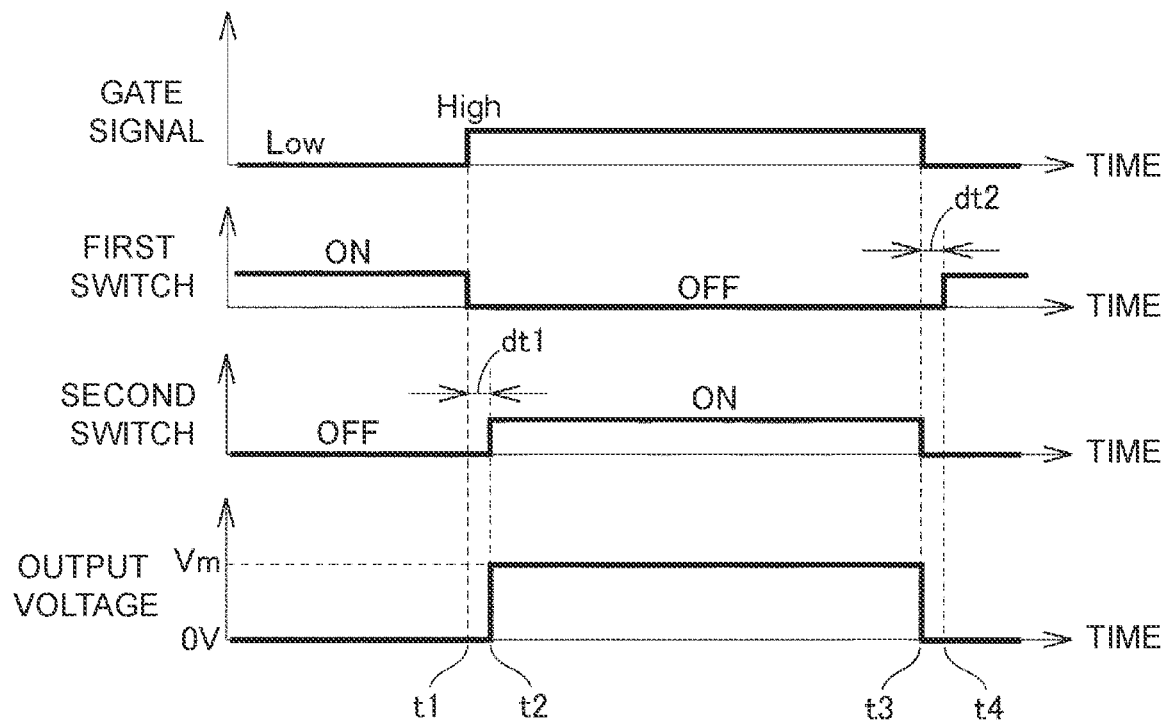
FIG. 3 is a timing chart showing an example of the operation of each battery circuit module that is controlled by a gate signal in the sweep unit shown in FIG. 2.

FIG. 3 is a timing chart showing an example of the operation of the battery circuit module M that is controlled by the gate signal. In the present embodiment, a rectangular wave signal is used as the gate signal for driving the SW 51 (first switch) and the SW 52 (second switch). "Low" and "High" of the gate signal shown in FIG. 3 mean L level and H level of the gate signal (rectangular wave signal), respectively. The "output voltage" signifies a voltage that is output between the output terminals OT1, OT2.

In the initial state of the battery circuit module M, no gate signal is input to the drive circuit SUA (gate signal=L level), and the SW 51 and the SW 52 are in the ON state and the OFF state, respectively. When the gate signal is input to the drive circuit SUA, the GD 81 drives the SW 51 and the SW 52 according to the received gate signal. In the example shown in FIG. 3, the gate signal rises from L level to H level at time t1, and the SW 51 switches from the ON state to the OFF state at the same time as the rise of the gate signal. The SW 52 switches from the OFF state to the ON state at time t2 delayed by a predetermined amount of time (hereinafter referred to as "dt1") from the rise of the gate signal. As a result, the battery circuit module M switches to the operating state. Hereinafter, the period of dt1 from the rise of the gate signal is sometimes referred to as "first delay period."

Figure 4:
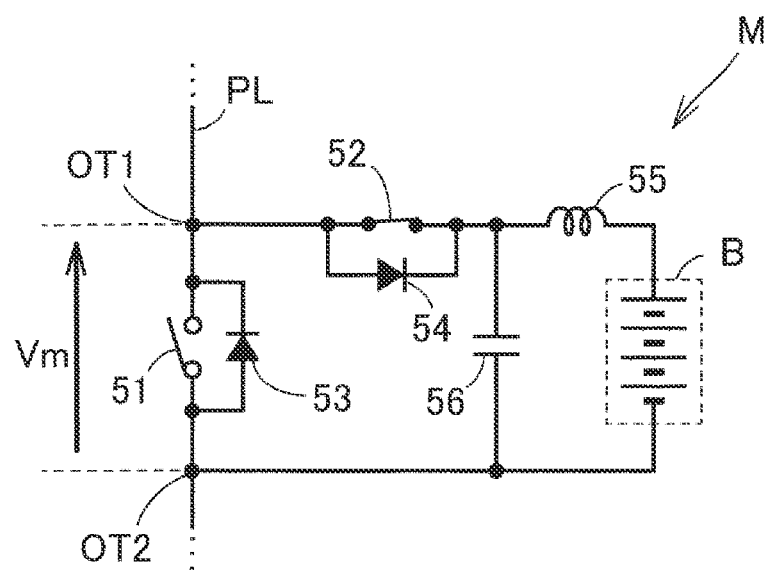
FIG. 4 shows the battery circuit module in an operating state in the sweep unit shown in FIG. 2.

FIG. 4 shows the battery circuit module M in the operating state. Referring to FIG. 4, in the battery circuit module M in the operating state, the voltage of the battery B is applied between the output terminals OT1, OT2 when the SW 51 is in the OFF state and the SW 52 is in the ON state. As the voltage of the battery B is applied between the output terminals OT1, OT2 via the capacitor 56, a voltage Vm is output between the output terminals OT1, OT2.

Referring back to FIG. 3, when the gate signal falls from H level to L level at time t3, the SW 52 switches from the ON state to the OFF state at the same time as the fall of the gate signal. As a result, the battery circuit module M switches to the stopped state. In the battery circuit module M in the stopped state, the voltage of the battery B is not applied between the output terminals OT1, OT2 as the SW 52 is in the OFF state. The SW 51 then switches from the OFF state to the ON state at time t4 delayed by a predetermined amount of time (hereinafter referred to as "dt2") from the fall of the gate signal. The values dt1, dt2 may be the same, or may be different from each other. In the present embodiment, dt1 and dt2 are 100 nanoseconds. However, dt1 and dt2 can be set as desired.

Hereinafter, the period of dt2 from the fall of the gate signal is sometimes referred to as "second delay period." The period from the end of the second delay period until the battery circuit module M switches to the operating state is sometimes referred to as "stop period."

Figure 5:
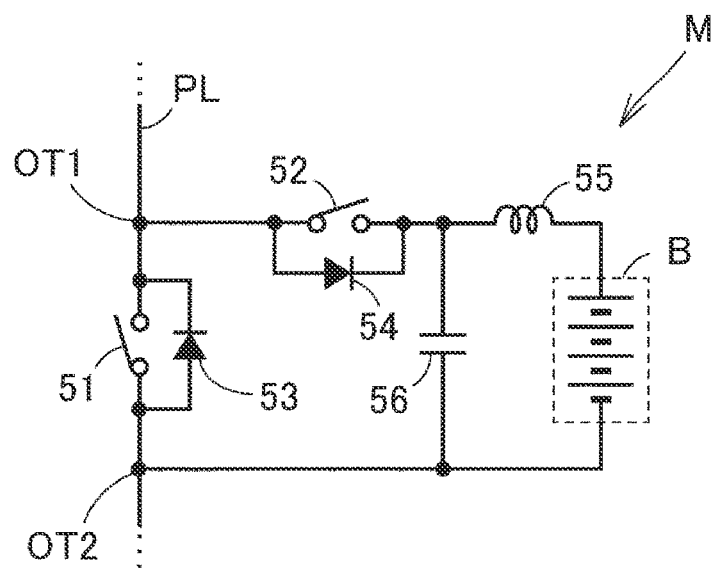
FIG. 5 shows the state of the battery circuit module during a delay period in the sweep unit shown in FIG. 2.

FIG. 5 shows the state of the battery circuit module M during the delay period. As shown in FIG. 5, both the SW 51 and the SW 52 are in the OFF state during each of the first delay period and the second delay period.

Figure 6:
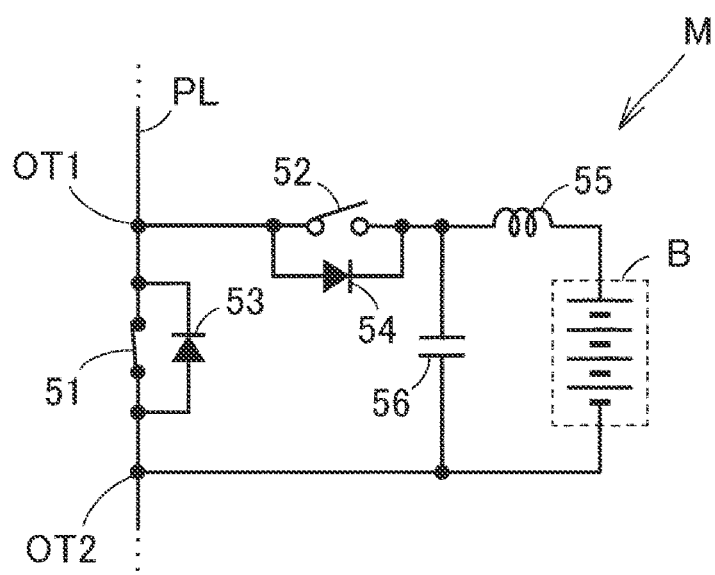
FIG. 6 shows the state of the battery circuit module during a stop period in the sweep unit shown in FIG. 2.

FIG. 6 shows the state of the battery circuit module M during the stop period. As shown in FIG. 6, the SW 51 is in the ON state and the SW 52 is in the OFF state during the stop period, as in the initial state.

The battery circuit module M is in the stopped state during each of the delay period and the stop period. In the battery circuit module M in the stopped state, no voltage is applied between the output terminals OT1, OT2. Providing the first delay period and the second delay period reduces the possibility that both the SW 51 and the SW 52 may be in the ON state at the same time (that is, the possibility that the battery circuit module M may be short-circuited).

The battery string St is configured to output a voltage in a rage of 0 V to the total voltage of the batteries B included in the battery string St. In the sweep unit SU, the SCU can control the output voltage of the battery string St by adjusting the number of battery circuit modules M that are in the operating state at the same time. In the present embodiment, the SCU controls the voltage of the battery string St by sweep control.

FIG. 7 illustrates an example of the sweep control. Referring to FIG. 7 together with FIGS. 2 and 3, in the battery string St subjected to the sweep control, a predetermined number of batteries B (three in the example shown in FIG. 7) are connected to the circuit, and the remaining batteries B are disconnected from the circuit. In the battery circuit module M, when the SW 51 is in the OFF state and the SW 52 is in the ON state, the battery B is connected to the circuit and the voltage of the battery B is applied to the circuit. In the battery circuit module M, when the SW 51 is in the ON state and the SW 52 is in the OFF state, the battery B is disconnected from the circuit, and the voltage of the battery B is not applied to the circuit (i.e., the battery B is in a pass-through state). In the sweep control, the predetermined number of batteries B (three in the example shown in FIG. 7) are always simultaneously connected to the circuit while the individual batteries B connected to the circuit are switched. The sweep unit SU performs the sweep control by sending the gate signal shown in FIG. 3 from one end (upstream end) to the other end (downstream end) of the battery string St while delaying it. The gate signal is delayed by the delay circuit 82. The GD 81 drives the SW 51 and the SW 52 according to the gate signal. Therefore, the battery B located downstream is connected to the circuit later than the battery B located upstream. For example, as shown in FIG. 7, the currents and SOCs are equalized among the batteries B included in the battery string St by sequentially connecting these batteries B included in the battery string St. The delay time of each delay circuit 82 is set by the GCU 100. The delay time may be set to zero (no delay). For example, when the delay times of all the delay circuits 82 in the sweep unit SU are set to zero, all the batteries B are switched to the connected state or the pass-through state at the same time.

The GCU 100 may control the input and output of the battery string St based on the period and duty cycle (ratio of the H level duration time to the period) of the gate signal. The GCU 100 can select between connection and disconnection for each cartridge Cg (battery B) in the battery string St. A disconnection instruction is sent from the GCU 100 to the SCU. The GD 81 instructed by the SCU to disconnect the corresponding battery B from the circuit may maintain the pass-through state of the corresponding battery B regardless of the gate signal. The SCU may disconnect the battery B from the circuit by switching each of the circuit breakers RB1, RB2 to the OFF state. The GCU 100 may adjust the load sharing of each battery B according to the capacity (or SOC) of each battery B. The GCU 100 may prohibit discharge or charge of a specific battery B based on the SOC of each battery B. For example, the GCU 100 may prohibit discharge of the battery B that can be overdischarged, or may prohibit charge of the battery B that can be overcharged. The GCU 100 may perform a degradation diagnosis using a constant load on a predetermined battery B in the battery string St. The GCU 100 may keep a faulty battery B (or a battery B with a high degree of degradation) disconnected from the circuit (see FIG. 6) in order to prohibit the use of that battery B.

The number of sweep units SU included in each of the first power supply circuit 2 and the second power supply circuit 3 shown in FIG. 1 corresponds to the number of battery strings St included in each of the first power supply circuit 2 and the second power supply circuit 3. Specifically, the first power supply circuit 2 includes three sweep units SU (hereinafter referred to as "SU1," "SU2," and "SU3") corresponding to the battery strings St1 to St3. The SCUs 12, 22, and 32 together with the battery strings St1, St2, and St3 form the sweep units SU1, SU2, and SU3, respectively. The battery string St, drive circuits SUA, and SCU of each sweep unit SU included in the first power supply circuit 2 are an example of the "direct-current battery string," the "first drive circuit," and the "first control circuit" according to the present disclosure, respectively. The second power supply circuit 3 includes six sweep units SU (hereinafter referred to as "SU4" to "SU9") corresponding to the battery strings St4 to St9. The SCUs 41, 42, 43, 44, 45, and 46 together with the battery strings St4, St5, St6, St7, St8, and St9 form the sweep units SU4, SU5, SU6, SU7, SU8, and SU9, respectively. The battery string St, drive circuits SUA, and SCU of each sweep unit SU included in the second power supply circuit 3 are an example of the "alternating-current battery string," the "second drive circuit," and the "second control circuit" according to the present disclosure, respectively.

By controlling the sweep units SU1 to SU3, the GCU 100 can cause each of the battery strings St1 to St3 to output DC power with a desired voltage (power with a constant voltage). The GCU 100 may determine the output voltage (DC power voltage) of each of the battery strings St1 to St3 based on information acquired from the user or the server 200. By controlling the sweep units SU4 to SU9, the GCU 100 can cause each of the battery strings St4 to St9 to output AC power (power whose voltage changes periodically in magnitude) with a desired voltage waveform. The GCU 100 may determine the output voltage waveform of each of the battery strings St4 to St9 based on information acquired from the user or the server 200. The user may input a power supply condition and/or a charge condition to the GCU 100.

In the present embodiment, high power batteries are used as the DC batteries (batteries B) included in the DC battery strings (battery strings St1, St2, and St3). Specifically, nickel metal hydride secondary batteries with a power density of 1500 W/kg or more and less than 5000 W/kg and an energy density of 50 Wh/kg or more and less than 500 Wh/kg are used as the DC batteries. High capacity batteries are used as the AC batteries (batteries B) included in the AC battery strings (battery strings St4 to St9). Specifically, lithium-ion secondary batteries with a power density of 300 W/kg or more and less than 1000 W/kg and an energy density of 500 Wh/kg or more and less than 1000 Wh/kg are used as the AC batteries. However, different kinds of lithium-ion batteries are used in the battery strings St4, St6, and St8 and in the battery strings St5, St7, and St9 (in other words, the kind of the lithium-ion batteries used in the battery strings St4, St6, and St8 is different from the kind of the lithium-ion batteries used in the battery strings St5, St7, and St9). Ternary (lithium nickel manganese cobalt oxide (NMC)) lithium-ion batteries are used as the batteries B in the battery strings St4, St6, and St8. Lithium iron phosphate (LFP) lithium-ion batteries are used as the batteries B in the battery strings St5, St7, and St9.

However, the kind (e.g., structure and material) and characteristics (e.g., power density and energy density) of the battery are not limited to those described above, and can be changed as appropriate. For example, a power (high power) battery and an energy (high capacity) battery may be defined based on a Ragone plot with the power density (W/kg) on the ordinate and the energy density (Wh/kg) on the abscissa. A battery classified as a high power battery by the Ragone plot may be used as a DC battery, and a battery classified as a high capacity battery by the Ragone plot may be used as an AC battery. A plurality of kinds of secondary batteries may be used in one battery string St. The battery may be a lithium-air battery, a lead-acid battery, a sodium-sulfur (NAS) battery, a redox flow battery, or an all-solid-state battery. The battery B may be manufactured by reusing secondary batteries that were used in xEVs, specifically by connecting the secondary batteries that were used in xEVs in series.

In the first power supply circuit 2, the DC power output from the battery strings St1, St2, and St3 is input to the inverters 11, 21, and 31, respectively. Hereinafter, the configuration of the inverters included in the first power supply circuit 2 will be described with reference to FIGS. 1 and 8. Since the inverters 11, 21, and 31 have the same configuration, the configuration of the inverter 11 will be described below as a representative example.

Figure 8:
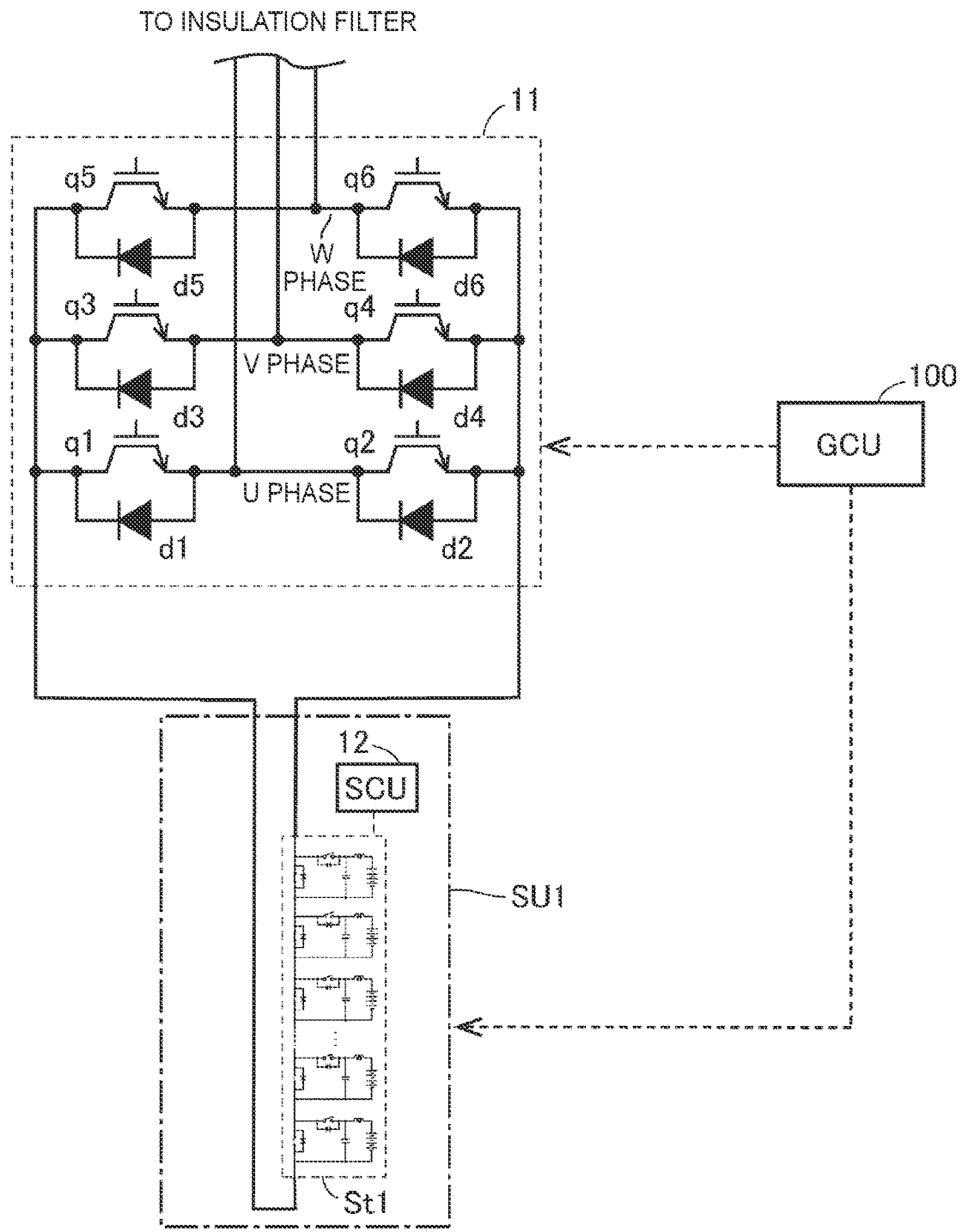
FIG. 8 shows a detailed configuration of an inverter shown in FIG. 1.

FIG. 8 shows a configuration of the inverter 11 included in the first power supply circuit 2. Referring to FIG. 8 together with FIG. 1, the inverter 11 is a three-phase inverter, and includes switching elements q1, q2 connected in series with a U-phase arm, switching elements q3, q4 connected in series with a V-phase arm, and switching elements q5, q6 connected in series with a W-phase arm. Each of diodes d1 to d6 is connected in antiparallel between the collector and the emitter of a corresponding one of the switching elements q1 to q6. In the present embodiment, a three-phase inverter that was used to drive a three-phase synchronous motor of an xEV is reused as the inverter 11. The inverter 11 is configured to convert power in both directions.

An intermediate point of each phase arm of the inverter 11 is connected to the insulation filter T1 and is further connected to the electrical wires PGL via the relay R1 and the distribution board C1 (see FIG. 1). The switching elements q1 to q6 of the inverter 11 are controlled by control commands from the GCU 100. Each switching element of the inverter 11 is turned ON or OFF by, for example, pulse width modulation (PWM) control.

The inverter 11 converts the DC power output from the battery string St1 to AC power (three-phase AC power) and supplies it to the electrical wires PGL. The inverter 11 functions as a DC-to-AC converter circuit. The AC power output from the inverter 11 is supplied to the electrical wires PGL via the insulation filter T1, the relay R1, and the distribution board C1. By controlling the SWs 51, 52 of each battery circuit module M in the battery string St1, the sweep unit SU1 can output power from any one or more of the batteries B in the battery string St1. The sweep unit SU1 outputs power from designated one or more batteries B to the inverter 11 according to, for example, a command from the GCU 100. The sweep units SU2, SU3 also output power from the batteries B in the battery strings St2, St3 to the inverters 21, 31, respectively, in a manner similar to that described above. The GCU 100 is configured to send commands for controlling the battery strings St1, St2, and St3 to the SCUs 12, 22, and 32 and control the inverters 11, 21, and 31 so that three-phase AC power is output from the first power supply circuit 2.

The inverter 11 converts the AC power (three-phase AC power) input from the power grid PG through the electrical wires PGL, the distribution board C1, the relay R1, and the insulation filter T1 to DC power, and outputs the DC power to the battery string St1. The sweep unit SU1 can charge the batteries B in the battery string St1 using the DC power supplied from the inverter 11. At this time, the GCU 100 controls the sweep unit SU1 so that the voltage of the battery string St1 becomes slightly lower than the AC voltage supplied from the power grid PG. By controlling the SWs 51, 52 of each battery circuit module M in the battery string St1, the sweep unit SU1 can charge any one or more of the batteries B in the battery string St1. The sweep unit SU1 charges designated one or more batteries B according to, for example, a command from the GCU 100. The sweep units SU2, SU3 also charge the batteries B in the battery strings St2, St3 in a manner similar to that described above. The GCU 100 is configured to send commands for controlling the battery strings St1, St2, and St3 to the SCUs 12, 22, and 32 and control the inverters 11, 21, and 31 so that predetermined batteries B in the battery strings St1, St2, and St3 are charged.

As shown in FIG. 1, the inverters 11, 21, and 31 are connected in parallel with the insulation filter T1. Specifically, intermediate points (see FIG. 8) of the phase arms of the inverters 11, 21, and 31 are connected to the insulation filter T1 by electrical wires. The first power supply circuit 2 outputs three-phase AC power (first AC power) using the battery strings St1, St2, and St3 that are connected in parallel and inverters 11, 21, and 31. In the present embodiment, the first power supply circuit 2 includes three DC battery strings (battery strings St1, St2, and St3) connected in parallel. As the number of DC battery strings connected in parallel becomes greater, it becomes easier to stabilize the AC power waveform output from the first power supply circuit 2. The number of DC battery strings included in the first power supply circuit 2 is not limited to three, and can be changed as appropriate. The first power supply circuit 2 may include one DC battery string, or may include four or more battery strings. The first power supply circuit 2 may be configured to output single-phase AC power.

Figure 9:
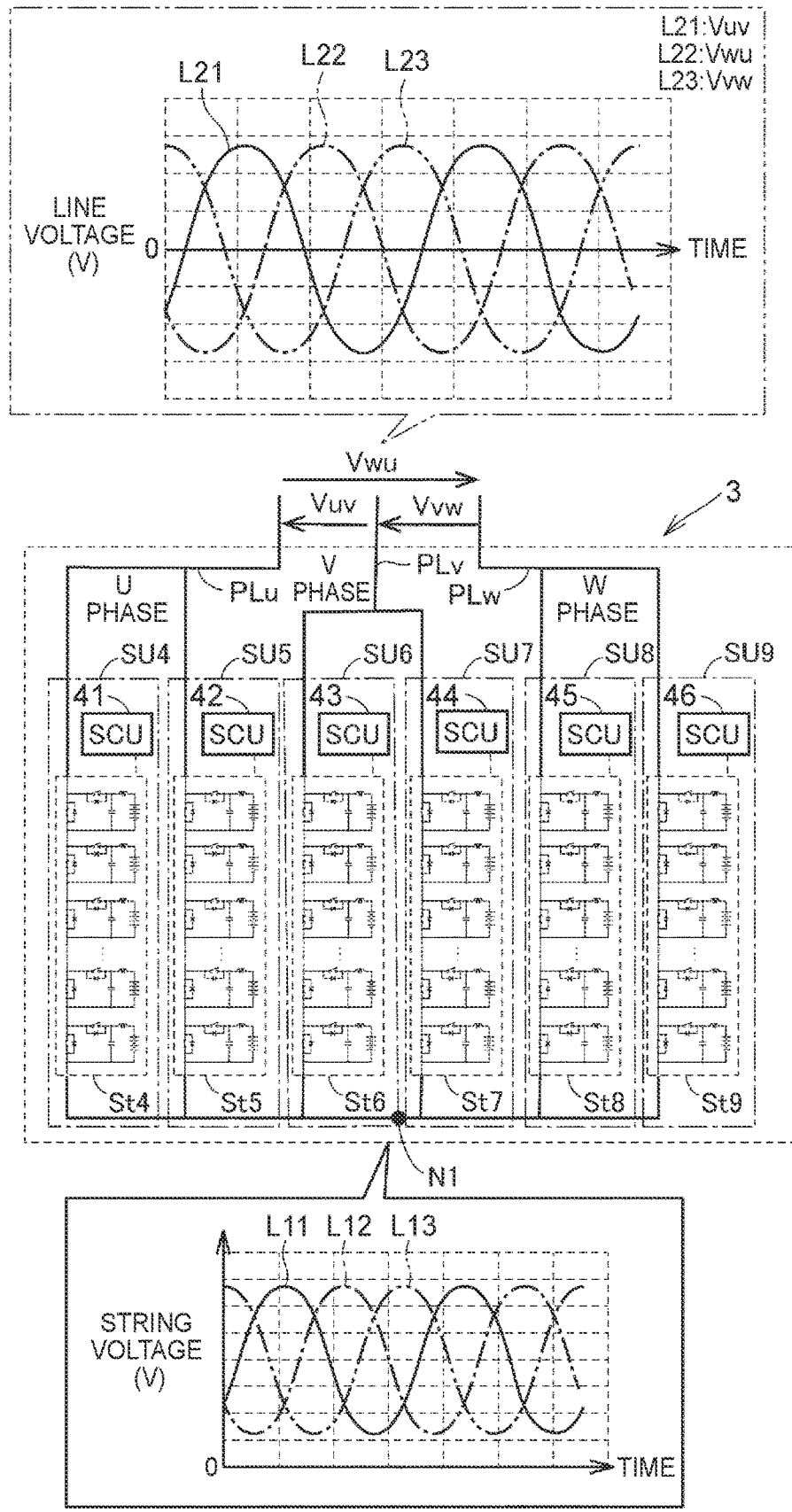
FIG. 9 shows a configuration of a second power supply circuit.

FIG. 9 shows a configuration of the second power supply circuit 3. Referring to FIG. 9, the battery strings St4, St5, St6, St7, St8, and St9 correspond to the first U-phase battery string, the second U-phase battery string, the first V-phase battery string, the second V-phase battery string, the first W-phase battery string, and the second W-phase battery string, respectively.

A positive terminal of the battery string St4 and a positive terminal of the battery string St5 are connected to an electrical wire PLu. A positive terminal of the battery string St6 and a positive terminal of the battery string St7 are connected to an electrical wire PLv. A positive terminal of the battery string St8 and a positive terminal of the battery string St9 are connected to an electrical wire PLw. Negative terminals of the battery strings St4 to St9 are connected to a neutral point N1. In the second power supply circuit 3, the battery strings St4, St5 connected in parallel, the battery strings St6, St7 connected in parallel, and the battery strings St8, St9 connected in parallel are Y-connected.

The SCUs 41 to 46 control the SWs 51, 52 of the battery circuit modules M shown in FIG. 2 at a switching frequency of several tens of kilohertz according to control commands from the GCU 100 to control the string voltages (output voltages) of the battery strings St4 to St9 so that these string voltages have voltage waveforms shown at the bottom of FIG. 9. In FIG. 9, line L11 represents the string voltage of the U-phase battery strings (battery strings St4, St5). Line L12 represents the string voltage of the V-phase battery strings (battery strings St6, St7). Line L13 represents the string voltage of the W-phase battery strings (battery strings St8, St9). Lines L11, L12, and L13 are sine waves that are 120° apart in phase, and their frequency is a frequency corresponding to the power grid PG (e.g., 60 Hz).

As the string voltages of the battery strings St4 to St9 are controlled as described above, the line voltages of the electrical wires PLu, PLv, and PLw have voltage waveforms shown at the top of FIG. 9. In FIG. 9, line L21 represents the line voltage "Vuv" between the electrical wire PLu and the electrical wire PLv, line L22 represents the line voltage "Vwu" between the electrical wire PLw and the electrical wire PLu, and line L23 represents the line voltage "Vvw" between the electrical wire PLv and the electrical wire PLw. Each line voltage has a sinusoidal AC waveform whose polarity (positive or negative) changes periodically.

As described above, the second power supply circuit 3 outputs three-phase AC power (second AC power) using the battery strings St4 to St9. In the second power supply circuit 3, the U-phase battery strings (battery strings St4, St5), the V-phase battery strings (battery strings St6, St7), and the W-phase battery strings (battery strings St8, St9) are Y-connected. The second power supply circuit 3 can therefore output AC power (more specifically, three-phase AC power) without using an inverter. This configuration reduces cost. In the second power supply circuit 3 according to the present embodiment, a plurality of battery strings connected in parallel is used as the AC battery strings of each phase. As the number of AC battery strings connected in parallel becomes greater, it becomes easier to finely adjust the AC power waveform output from the second power supply circuit 3. The number of AC battery strings included in the second power supply circuit 3 is not limited to six, and can be changed as appropriate. The second power supply circuit 3 may include three AC battery strings, or may include one AC battery string. The second power supply circuit 3 may be configured to output single-phase AC power.

The AC power output from the first power supply circuit 2 is supplied to the electrical wires PGL via the insulation filter T1, the relay R1, and the distribution board C1. The AC power output from the second power supply circuit 3 is supplied to the electrical wires PGL via the insulation filter T2, the relay R2, and the distribution board C1. The power supply system 1 is configured to reversely supply the three-phase AC power from at least one of the first power supply circuit 2 and the second power supply circuit 3 to the power grid PG in grid-connected operation.

Each of the insulation filters T1, T2 includes, for example, an LCL filter and a three-phase transformer. Each of the insulation filters T1, T2 reduces the noise component of the three-phase AC power using the LCL filter, and converts the three-phase AC power to a predetermined voltage (e.g., 200 V) and insulates the input and output sides using the three-phase transformer. In the present embodiment, the inverters 11, 21, and 31 are reused products used for another purpose (for driving an xEV), and do not necessarily have high performance. Therefore, the inverter outputs tend to contain noise. The insulation filter T1 disposed between the first power supply circuit 2 and the electrical wires PGL is configured to remove such noise. The insulation filter T1 may have a higher noise reduction capability than the insulation filter T2.

Each of the relays R1, R2 is, for example, an electromagnetic mechanical relay. The GCU 100 is configured to switch the state of the first power supply circuit 2 and the power grid PG between a connected state (parallel-on state) and a disconnected state (parallel-off state) by controlling ON and OFF of the relay R1. The GCU 100 is also configured to switch the state of the second power supply circuit 3 and the power grid PG between a connected state (parallel-on state) and a disconnected state (parallel-off state) by controlling ON and OFF of the relay R2.

The distribution board C1 supplies power from the power grid PG to each of the first power supply circuit 2 and the second power supply circuit 3. The distribution board C1 also supplies power from at least one of the first power supply circuit 2 and the second power supply circuit 3 to the power grid PG and/or the building 300 (distribution board C2). The AC power output from the first power supply circuit 2 and the AC power output from the second power supply circuit 3 together with the AC power output from the power grid PG are supplied to the electrical wires PGL and are further supplied to the wires in the building 300 via the distribution board C2.

The power supply system 1 is configured to perform a first output for outputting AC power (first AC power) only from the first power supply circuit 2 out of the first power supply circuit 2 and the second power supply circuit 3, a second output for outputting AC power (second AC power) only from the second power supply circuit 3 out of the first power supply circuit 2 and the second power supply circuit 3, and both outputs for outputting AC power (first AC power and second AC power) from both of the first power supply circuit 2 and the second power supply circuit 3. In the both outputs, the first power supply circuit 2 and the second power supply circuit 3 output AC power simultaneously. The power supply system 1 is also configured to perform a first input for inputting AC power only to the first power supply circuit 2 out of the first power supply circuit 2 and the second power supply circuit 3, a second input for inputting AC power only to the second power supply circuit 3 out of the first power supply circuit 2 and the second power supply circuit 3, and both inputs for inputting AC power to both of the first power supply circuit 2 and the second power supply circuit 3. In the both inputs, the AC power is simultaneously input to the first power supply circuit 2 and the second power supply circuit 3. In the present embodiment, the GCU 100 selects and performs one of the following: the first output, the second output, the both outputs, the first input, the second input, and the both inputs.

The GCU 100 is configured to switch among the first output, the second output, and the both outputs. The GCU 100 is configured to switch among the first input, the second input, and the both inputs. The GCU 100 keeps the relay R1 in the ON state and the relay R2 in the OFF state while performing the first output or the first input. The GCU 100 keeps the relay R1 in the OFF state and the relay R2 in the ON state while performing the second output or the second input. The GCU 100 keeps both the relay R1 and the relay R2 in the ON state while performing the both outputs or the both inputs. When AC power is neither input to nor output from the first power supply circuit 2 and the second power supply circuit 3, the GCU 100 switches both the relay R1 and the relay R2 to the OFF state.

The GCU 100 is configured to perform a degradation diagnosis on each of the batteries B included in the DC battery strings (battery strings St1 to St3) and the batteries B included in the AC battery strings (battery strings St4 to St9). In the present embodiment, the degradation diagnosis is performed on one or more batteries B for which a predetermined amount of time has passed since the previous diagnosis among the batteries B included in the DC battery strings and the AC battery strings. The degradation diagnosis may be simultaneously performed on a plurality of batteries B, or may be performed each battery B on a one-by-one basis.

Hereinafter, the battery B on which the GCU 100 performs the degradation diagnosis is referred to as "diagnostic target." The GCU 100 is configured to perform the degradation diagnosis on a diagnostic target using data continuously acquired during at least one of charging and discharging of the diagnostic target (hereinafter sometimes referred to as "diagnostic data"). The diagnostic data may include changes in voltage and current of the diagnostic target during charging or discharging of the diagnostic target. The diagnostic data may include changes in temperature of the diagnostic target during charging or discharging of the diagnostic target. The GCU 100 may obtain at least one of the full charge capacity and internal resistance of the diagnostic target using the diagnostic data. The GCU 100 may obtain the internal resistance of the diagnostic target from the relationship between the battery voltage and battery current obtained as the diagnostic data. The GCU 100 may obtain the full charge capacity of the diagnostic target based on the battery voltage of the diagnostic target charged from the empty state to the fully charged state at a constant rate. The GCU 100 may use the battery temperature to improve the accuracy of obtaining the full charge capacity and internal resistance of the diagnostic target.

Figure 10:
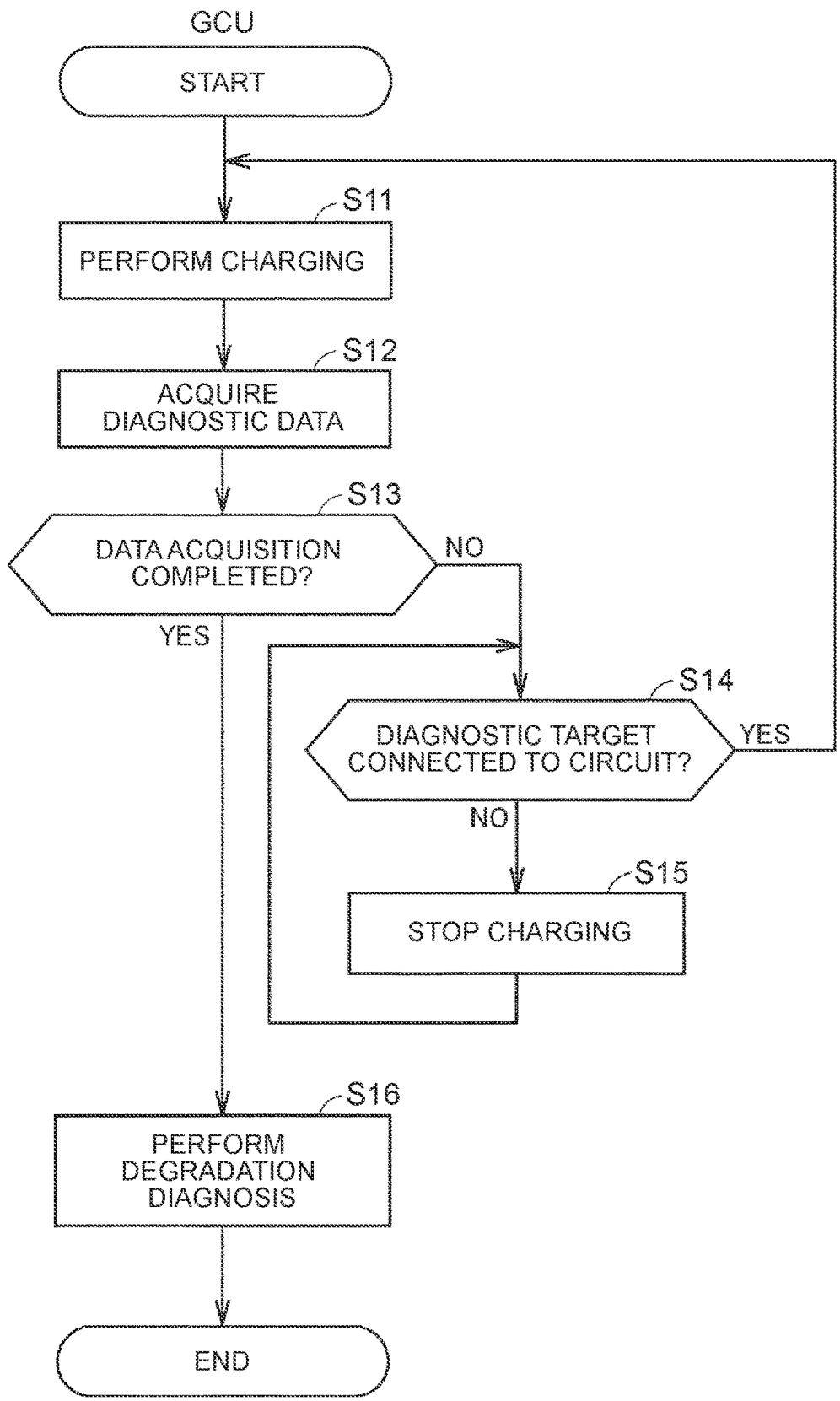
FIG. 10 is a flowchart showing a first example of a process related to a degradation diagnosis that is performed on a battery by a group control unit (GCU) (control device) shown in FIG. 1.

FIG. 10 is a flowchart showing a first example of a process related to the battery degradation diagnosis that is performed by the GCU 100. The process shown in this flowchart is started when preparation for diagnosis is completed for the battery B (diagnostic target) for which a predetermined diagnosis timing has come. The predetermined diagnosis timing may be a timing when the predetermined amount of time has passed since the previous diagnosis. The GCU 100 may determine that the preparation for diagnosis is completed when the diagnostic target is connected to the circuit (see, e.g., FIG. 4) and the SOC of the diagnostic target is within a predetermined range (e.g., the range of a predetermined SOC value or less). Hereinafter, each step in the flowchart is simply represented by "S."

Referring to FIG. 10 together with FIGS. 1 and 2, in S11, the GCU 100 performs charging of the diagnostic target at a predetermined rate C using the power supplied from the power grid PG. The predetermined rate C may be a current small enough not to affect the supply and demand balance of the power grid PG. The charging current is adjusted by, for example, a charge command sent from the GCU 100 to the target sweep unit SU (one of the sweep units SU1 to SU9 corresponding to the diagnostic target).

The GCU 100 then acquires diagnostic data in S12. Specifically, the monitoring unit BS detects the current, voltage, and temperature of the diagnostic target that is being charged (FIG. 2). The detected diagnostic data is stored in the storage device of the GCU 100. Thereafter, the GCU 100 determines in S13 whether the acquisition of the diagnostic data to be used for diagnosis is completed. When the acquisition of the diagnostic data is not completed (NO in S13), the GCU 100 determines in S14 whether the diagnostic target is connected to the circuit. The GCU 100 determines whether the diagnostic target is connected to the circuit based on, for example, the state of the SW 52 (FIG. 2) that switches between connection and disconnection of the diagnostic target and the circuit. Specifically, the GCU 100 determines that the diagnostic target is connected to the circuit when the SW 52 is in the electrically connected state, and determines that the diagnostic target is disconnected from the circuit when the SW 52 is in the electrically disconnected state. As will be described in detail later, in the present embodiment, the battery B that is being subjected to the degradation diagnosis may be disconnected from the circuit (see S105 in FIG. 14).

When the diagnostic target is connected to the circuit (YES in S14), the routine returns to S11. In a period in which the acquisition of the diagnostic data is not completed and the diagnostic target is connected to the circuit (NO in S13 and YES in S14), the GCU 100 keeps performing charging and acquiring the diagnostic data (S11 and S12), and continuously detects and stores the current, voltage, and temperature of the diagnostic target that is being charged. On the other hand, when the diagnostic target is disconnected from the circuit (NO in S14), the GCU 100 sends a command to stop charging of the diagnostic target to the target sweep unit SU in S15. The GCU 100 thus stops charging of the diagnostic target and waits until the diagnostic target is reconnected to the circuit (S14 and S15). When the diagnostic target is reconnected to the circuit (YES in S14), the GCU 100 resumes charging of the diagnostic target and acquisition of the diagnostic data (S11 and S12).

When the acquisition of the diagnostic data is completed (YES in S13), the GCU 100 performs the degradation diagnosis on the diagnostic target using the diagnostic data continuously acquired during charging of the diagnostic target in S16. Specifically, the GCU 100 determines at least one of the full charge capacity and internal resistance of the diagnostic target. The series of steps in FIG. 10 ends when S16 is performed.

Figure 11:
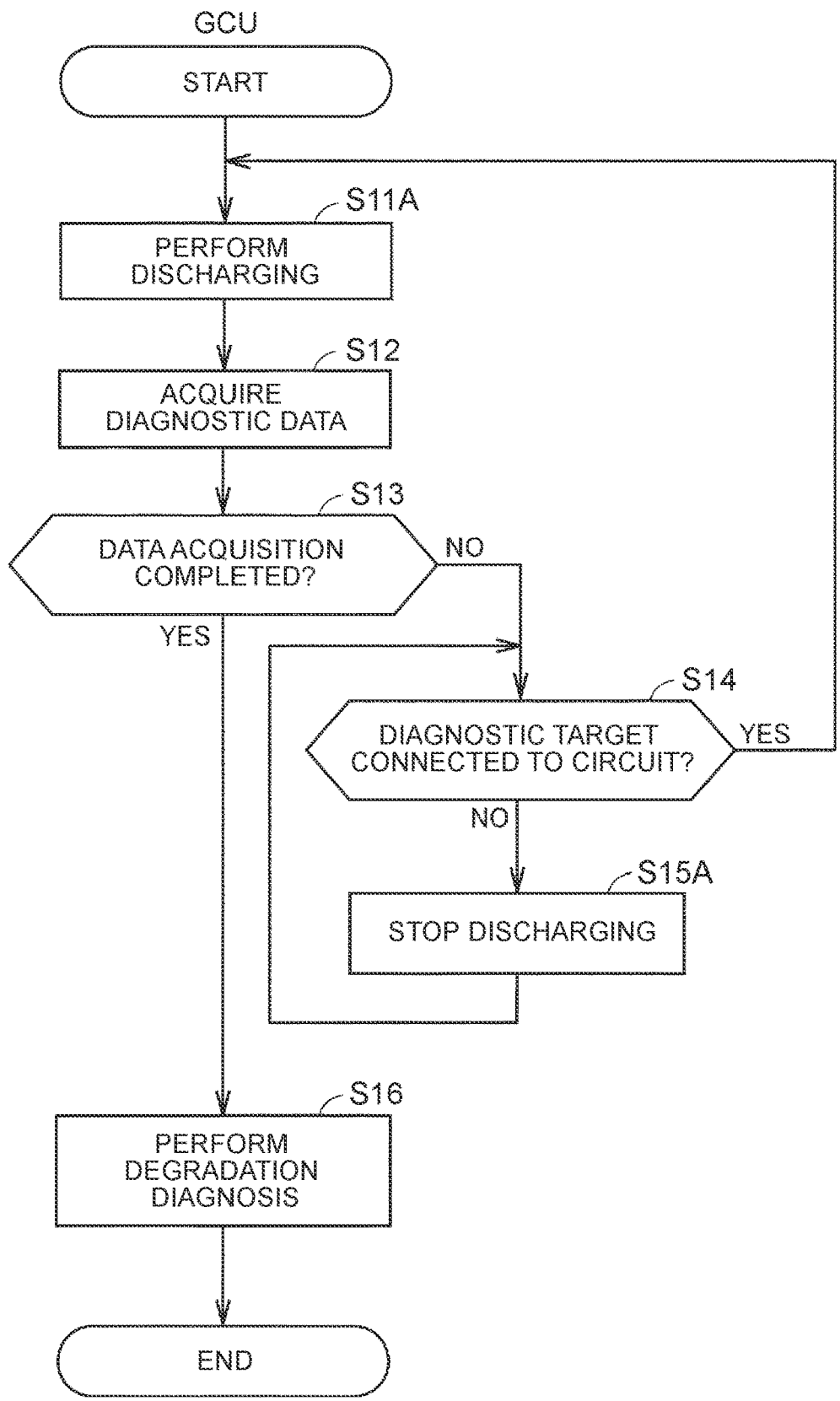
FIG. 11 is a flowchart showing a second example of the process related to a degradation diagnosis that is performed on a battery by the GCU (control device) shown in FIG. 1.

FIG. 11 is a flowchart showing a second example of the process related to the battery degradation diagnosis that is performed by the GCU 100. The process shown in this flowchart is started when preparation for diagnosis is completed for the battery B (diagnostic target) for which a predetermined diagnosis timing has come. The GCU 100 may determine that the preparation for diagnosis is completed when the diagnostic target is connected to the circuit (see, e.g., FIG. 4) and the SOC of the diagnostic target is within a predetermined range (e.g., the range of a predetermined SOC value or less).

The process shown in FIG. 11 is the same as that shown in FIG. 10 except that the process includes S11A and S15A instead of S11 and S15 (FIG. 10). In S11A, the GCU 100 performs discharging of the diagnostic target at a predetermined rate C. The predetermined rate C may be a current small enough not to affect the supply and demand balance of the power grid PG. The discharging current is adjusted by, for example, a discharge command sent from the GCU 100 to the target sweep unit SU. In S15A, the GCU 100 sends a command to stop discharging of the diagnostic target to the target sweep unit SU. Thereafter, in S16, the GCU 100 performs the degradation diagnosis on the diagnostic target using diagnostic data continuously acquired during discharging of the diagnostic target.

In the present embodiment, the GCU 100 is configured to perform both the process shown in FIG. 10 and the process shown in FIG. 11. For example, when the degradation diagnosis is performed in parallel with energy management, the GCU 100 may switch between the process shown in FIG. 10 and the process shown in FIG. 11 according to the direction of current (charging or discharging) of the energy management. The GCU 100 may switch between the process shown in FIG. 10 and the process shown in FIG. 11 according to the SOC of the diagnostic target at the start of diagnosis. The GCU 100 may perform the degradation diagnosis with high accuracy using two kinds of diagnosis results (charging and discharging). The GCU 100 may obtain the full charge capacity of the diagnostic target by the process shown in FIG. 10 after obtaining the internal resistance of the diagnostic target by the process shown in FIG. 11. However, the present disclosure is not limited to this, and the GCU 100 may be configured to perform only one of the processes shown in FIGS. 10 and 11.

The server 200 shown in FIG. 1 requests the user of the power supply system 1 to perform adjustment of power of the power grid PG, as necessary. The server 200 may perform demand response (DR). In the present embodiment, the server 200 requests one of FCR, S-FRR, FRR, RR, and RR-FIT that will be described below.

FIG. 12 shows an example of the kinds and contents of power adjustment. Referring to FIG. 12, the electric power company (TSO) may call for bids for at least one of FCR, S-FRR, FRR, RR, and RR-FIT corresponding to the control reserves of the power grid PG (FIG. 1) in the balancing market, and request the winning user to perform power adjustment corresponding to the won control reserve.

FCR is frequency containment reserve that controls (adjusts) a very short-period component (cyclic component), and is also called "primary control reserve." With regard to FCR, the response time is within 10 seconds and the duration time is five minutes. FCR is performed by local control (offline). The response time signifies a time from reception of a command to output of electric power.

S-FRR is synchronized frequency restoration reserve that controls (adjusts) a short-period component (fringe component). FRR is frequency restoration reserve that controls (adjusts) a long-period component (sustained component). S-FRR and FRR are sometimes collectively referred to as "secondary control reserve." Each of S-FRR and FRR is performed by remote control. As for each of S-FRR and FRR, the response time is within five minutes and the duration time is 30 minutes. In the remote control for S-FRR, a load frequency control (LFC) signal is used, and the command intervals are 0.5 seconds to several tens of seconds. In the remote control for FRR, an economic load dispatching control (EDC) signal is used, and the command intervals are one to several minutes.

RR is replacement reserve that controls (adjusts) a long-period component (sustained component). RR-FIT is replacement reserve for feed-in tariff. RR and RR-FIT are sometimes collectively referred to as "tertiary control reserve." Each of RR and RR-FIT is performed by remote control. As for RR, the response time is within 15 minutes and the duration time is three hours. In the remote control for RR, an EDC signal is used, and the command intervals are one to several minutes. As for RR-FIT, the response time is within 45 minutes and the duration time is three hours. In the remote control for RR-FIT, a balancing command to compensate for an output prediction error (error between predicted and actual values) of renewable energy is sent via a dedicated line or a simple command system, and the command intervals are 30 minutes.

When the server 200 requests the user, who won the control reserve in the balancing market, to perform power adjustment (energy management), the server 200 sends a signal requesting power adjustment (hereinafter sometimes referred to as "DR signal") to a user terminal. The DR signal indicates the content of the power adjustment (energy management) requested from the server 200. In the present embodiment, the DR signal includes the kind of power adjustment (in the present embodiment, FCR, S-FRR, FRR, RR, or RR-FIT), control method (e.g., local control or remote control), adjustment period (information indicating an adjustment start time and an adjustment end time), power adjustment amount (ΔkW), a requested duration time, and a requested response time.

The DR signal is stored in the storage device of the GCU 100. The user terminal may be an in-vehicle terminal, a mobile terminal carried by the user, or the GCU 100. Examples of the mobile terminal include a laptop, a smartphone, a wearable device, an electronic key, and a service tool. In a mode in which the user terminal is an in-vehicle terminal or a mobile terminal, the user terminal that has received the DR signal from the server 200 sends the DR signal to the GCU 100. The GCU 100 stores the DR signal in the storage device.

In the case where the control reserve is the secondary or tertiary control reserve (S-FRR, FRR, RR, or RR-FIT), the server 200 starts remotely controlling the GCU 100 (that is, starts sending a command to the GCU 100) when the adjustment start time comes. In the remote control, the input and output power of at least one of the first power supply circuit 2 and the second power supply circuit 3 is controlled so that the adjustment of power of the power grid PG is performed according to the command from the server 200.

In the case where the control reserve is the primary control reserve (FCR), the GCU 100 starts local control when the adjustment start time comes. In the local control, the GCU 100 controls the input and output power of at least one of the first power supply circuit 2 and the second power supply circuit 3 so that frequency fluctuations of the power supplied from the power grid PG to the building 300 are reduced, based on the detected values from the power sensors C1$a$, C1$b$, and C1$c$.

FIG. 13 is a flowchart showing an example of a process related to power adjustment (energy management) that is performed by the GCU 100. The process shown in this flowchart is started when, for example, a new DR signal is added to the storage device of the GCU 100. However, the present disclosure is not limited to this, and the series of steps shown in FIG. 13 may be started a predetermined amount of time (e.g., the amount of time selected from the range of 5 minutes or more and 3 hours or less, i.e., the range of 5 minutes to 3 hours) before the adjustment start time indicated by the DR signal.

Figure 14:
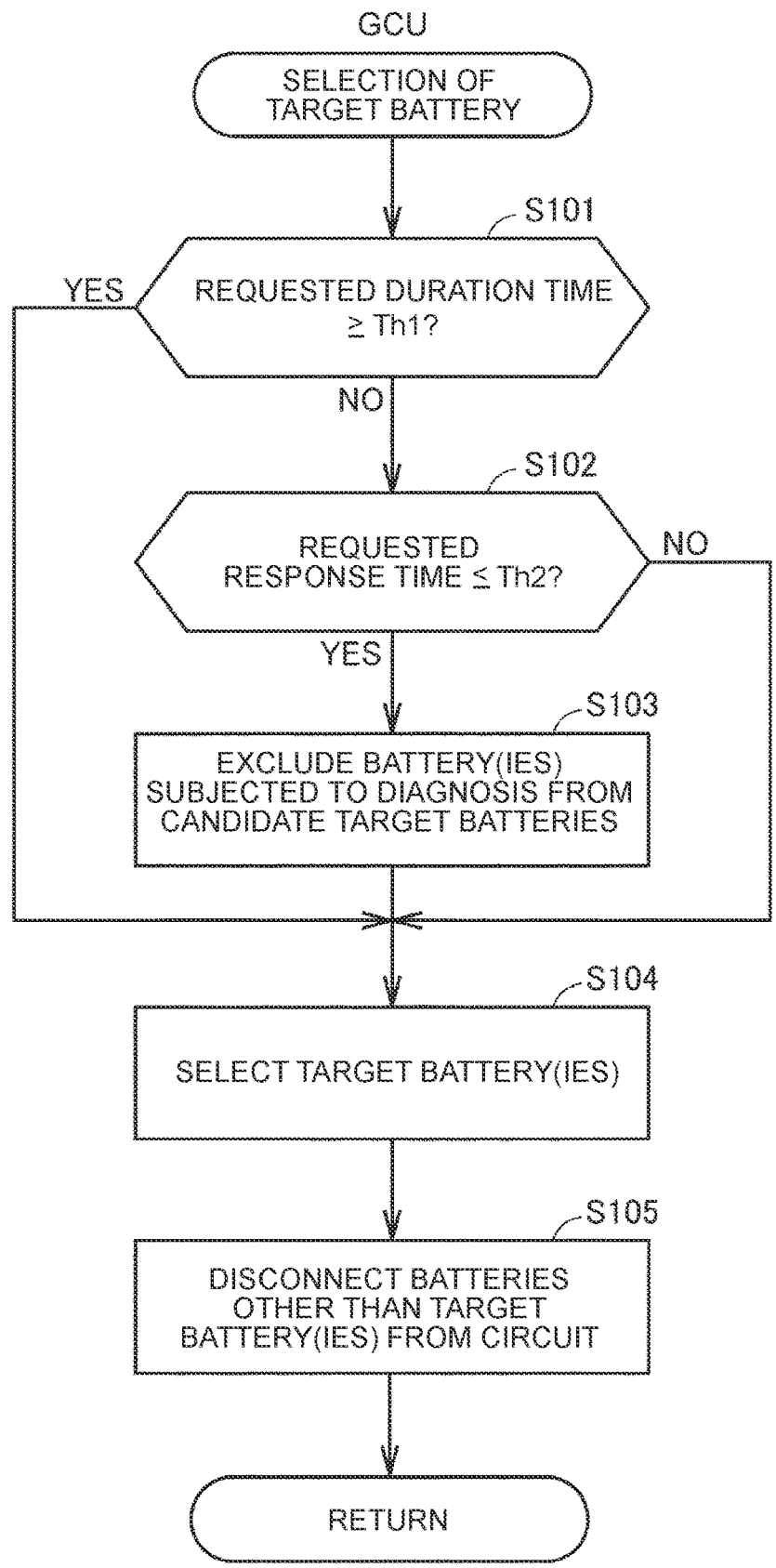
FIG. 14 is a flowchart showing details of a process related to selection of a target battery shown in FIG. 13.

Referring to FIG. 13 together with FIGS. 1 and 2, in S21, the GCU 100 selects one or more target batteries that are to perform requested power adjustment from the batteries B included in the DC battery strings (battery strings St1 to St3) and the AC battery strings (battery strings St4 to St9). FIG. 14 is a flowchart showing details of S21 (selection of target battery).

Referring to FIG. 14 together with FIGS. 1 and 2, the GCU 100 first determines in S101 and S102 whether power fluctuations in the requested power adjustment are acceptable for the degradation diagnosis. Specifically, in S101, the GCU 100 determines whether the requested duration time is equal to or greater than a first reference value (hereinafter referred to as "Th1"), based on the DR signal. Th1 indicates a boundary value (lower limit value) of the duration time during which power fluctuations in the power adjustment are small enough that the degradation diagnosis can be performed. In S102, the GCU 100 determines whether the requested response time is equal to or less than a second reference value (hereinafter referred to as "Th2"). Th2 indicates a boundary value (upper limit value) of the response time in the power adjustment in which power fluctuations are so large that the degradation diagnosis cannot be performed. For example, Th1 and Th2 may be set to values experimentally obtained in advance by the user. In the present embodiment, Th1 and Th2 are set to two hours and 10 minutes, respectively. Th1 and Th2 can be changed as appropriate.

When the requested duration time is Th1 or more (YES in S101), the GCU 100 determines that the power fluctuations in the requested power adjustment are not large (acceptable for the degradation diagnosis). When NO in S101, the routine proceeds to S102. When the required response time is Th2 or less (YES in S102), the GCU 100 determines that the power fluctuations in the requested power adjustment are large (not acceptable for the degradation diagnosis). When NO in both S101 and S102, the GCU 100 determines that the power fluctuations in the requested power adjustment are not large (acceptable for the degradation diagnosis).

When the GCU 100 determines that the power fluctuations in the requested power adjustment are large (not acceptable for the degradation diagnosis), the routine proceeds to S104 through S103. In the present embodiment, when the requested power adjustment is a primary or secondary control reserve (FCR, S-FRR, or FRR), the routine proceeds to S103. When the GCU 100 determines that the power fluctuations in the requested power adjustment are not large (acceptable for the degradation diagnosis), the routine proceeds to S104 without going through S103. In the present embodiment, when the requested power adjustment is a tertiary control reserve (RR or RR-FIT), the routine proceeds to S104 without going through S103.

In S103, the GCU 100 excludes a battery (or batteries) that is (are) being subjected to the degradation diagnosis from candidate target batteries. Specifically, the diagnostic target in the process shown in FIG. 10 or FIG. 11 is excluded from the candidate target batteries. The routine then proceeds to S104.

In the present embodiment, only the battery that is being subjected to the degradation diagnosis is excluded from the candidate target batteries. However, the present disclosure is not limited to this, and a predetermined battery in addition to the battery that is being subjected to the degradation diagnosis may be excluded from the candidate target batteries. For example, a battery with a high degree of degradation may be excluded from the candidate target batteries. A battery whose SOC is out of a predetermined range (e.g., out of the range of 30% to 70%) may be excluded from the candidate target batteries.

In S104, the GCU 100 selects one or more target batteries that are to perform the requested power adjustment, based on the kind and condition of the power adjustment indicated by the DR signal. Basically, all the batteries B included in the first power supply circuit 2 and the second power supply circuit 3 are candidate target batteries. However, the battery excluded in S103 will not be selected as a target battery.

The GCU 100 may determine the target battery according to the kind of the requested power adjustment. For example, the GCU 100 may select only a DC battery as a target battery for the primary control reserve (FCR). The GCU 100 may select all the DC batteries included in the candidate target batteries as target batteries, or may select a predetermined number of DC batteries as target batteries. The GCU 100 may select only an AC battery as a target battery for the secondary control reserve (S-FRR or FRR). The GCU 100 may select all the AC batteries included in the candidate target batteries as target batteries, or may select a predetermined number of AC batteries as target batteries. The GCU 100 may select both a DC battery and an AC battery as target batteries for the tertiary control reserve (RR or RR-FIT). The GCU 100 may select all the DC and AC batteries included in the candidate target batteries as target batteries, or may select a predetermined number of DC and AC batteries as target batteries. When selecting a predetermined number of batteries from the candidate target batteries, the GCU 100 may preferentially select batteries with low degrees of degradation.

In S105, the GCU 100 disconnects the batteries B other than the one or more target batteries (that is, the GCU 100 disconnects each battery B that has not been selected in S104) from the circuit. Specifically, the GCU 100 disconnects each battery B (that has not been selected in S104) from the circuit by switching the SW 51 to the electrically connected state and the SW 52 to the electrically disconnected state (see FIG. 6). Each battery B disconnected from the circuit in S105 is kept disconnected from the circuit (in the pass-through state) until the requested power adjustment ends. With regard to the battery (diagnostic target) excluded from the candidate target batteries in S103, the degradation diagnosis is interrupted in S14 and S15 in FIG. 10 (or S14 and S15A in FIG. 11). When S105 is performed, the series of steps shown in FIG. 14 ends, and the routine proceeds to S22 in FIG. 13.

Figure 15:
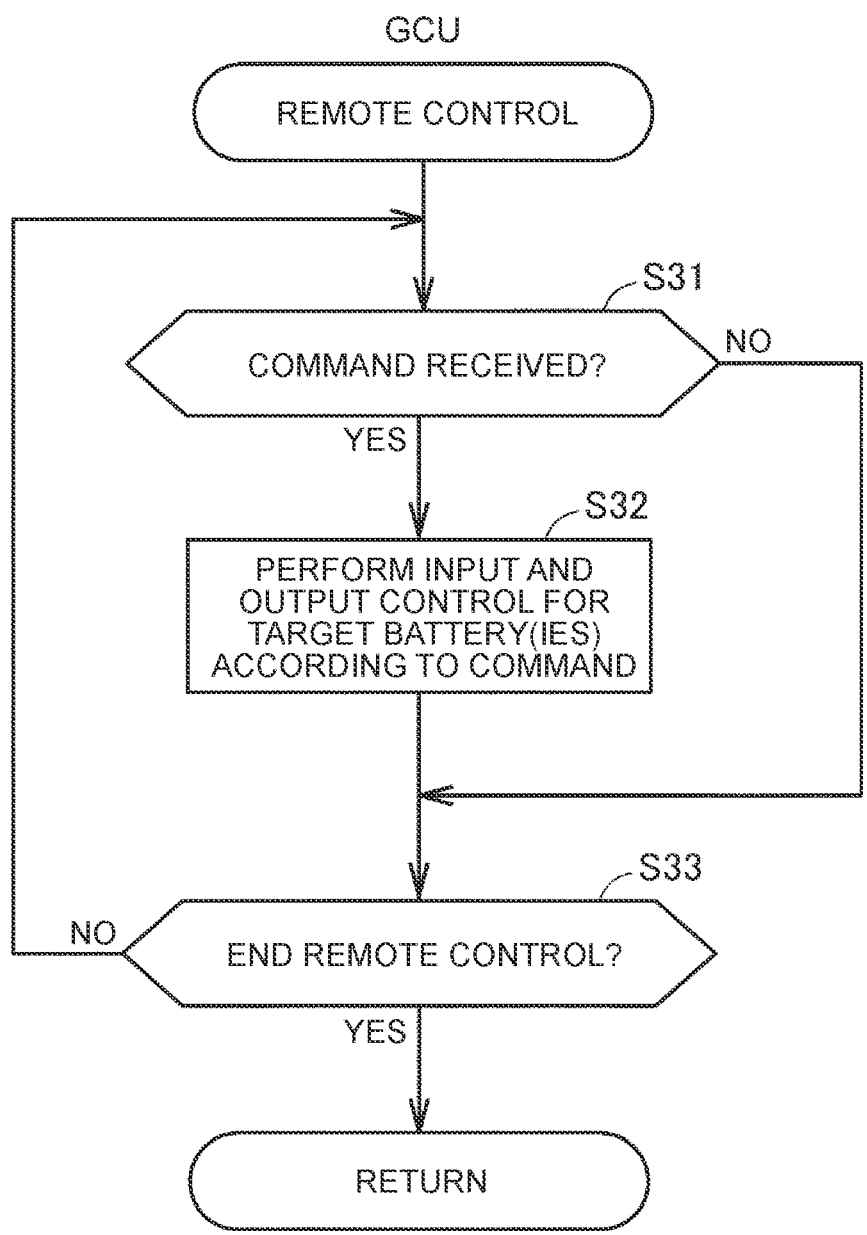
FIG. 15 is a flowchart showing details of a process related to power adjustment that is performed by remote control shown in FIG. 13.

Referring back to FIG. 13 together with FIGS. 1 and 2, the GCU 100 determines in S22 whether the control method for the requested power adjustment is remote control or local control, based on the DR signal. When the GCU 100 determines in S22 that the control method for the requested power adjustment is remote control, the GCU 100 performs the power adjustment by remote control in S23. FIG. 15 is a flowchart showing details of S23 (power adjustment by remote control).

Referring to FIG. 15 together with FIGS. 1 and 2, the GCU 100 determines in S31 whether it has received a command from the server 200. When the GCU 100 has not received the command (NO in S31), the routine proceeds to S33. In S33, the GCU 100 determines whether a remote control end condition is satisfied. When the remote control end condition is not satisfied (NO in S33), the routine returns to S31. For example, the remote control end condition is satisfied when the adjustment end time comes. The remote control end condition is also satisfied when the GCU 100 receives an end notification from the server 200. However, the present disclosure is not limited to this, and the remote control end condition can be set as desired.

When the GCU 100 receives the command (YES in S31), the GCU 100 performs input and output control according to the command using the one or more target batteries (S104 in FIG. 14) in S32. The GCU 100 causes the one or more target batteries to receive or output power according to the requested power adjustment, with the batteries B other than the one or more target batteries being disconnected from the circuit (i.e., in a state where the batteries B other than the one or more target batteries are disconnected from the circuit). The requested power adjustment for the power grid PG (i.e., the requested adjustment of power of the power grid PG) is thus performed. When the GCU 100 performs the input and output control according to the command in S32, the routine proceeds to S33. The remote control (S31 to S32) according to the command from the server 200 is continued while the remote control end condition is not satisfied (NO in S33). When the remote control end condition is satisfied (YES in S33), the series of steps shown in FIG. 15 ends, and the routine proceeds to S25 in FIG. 13.

Figure 16:
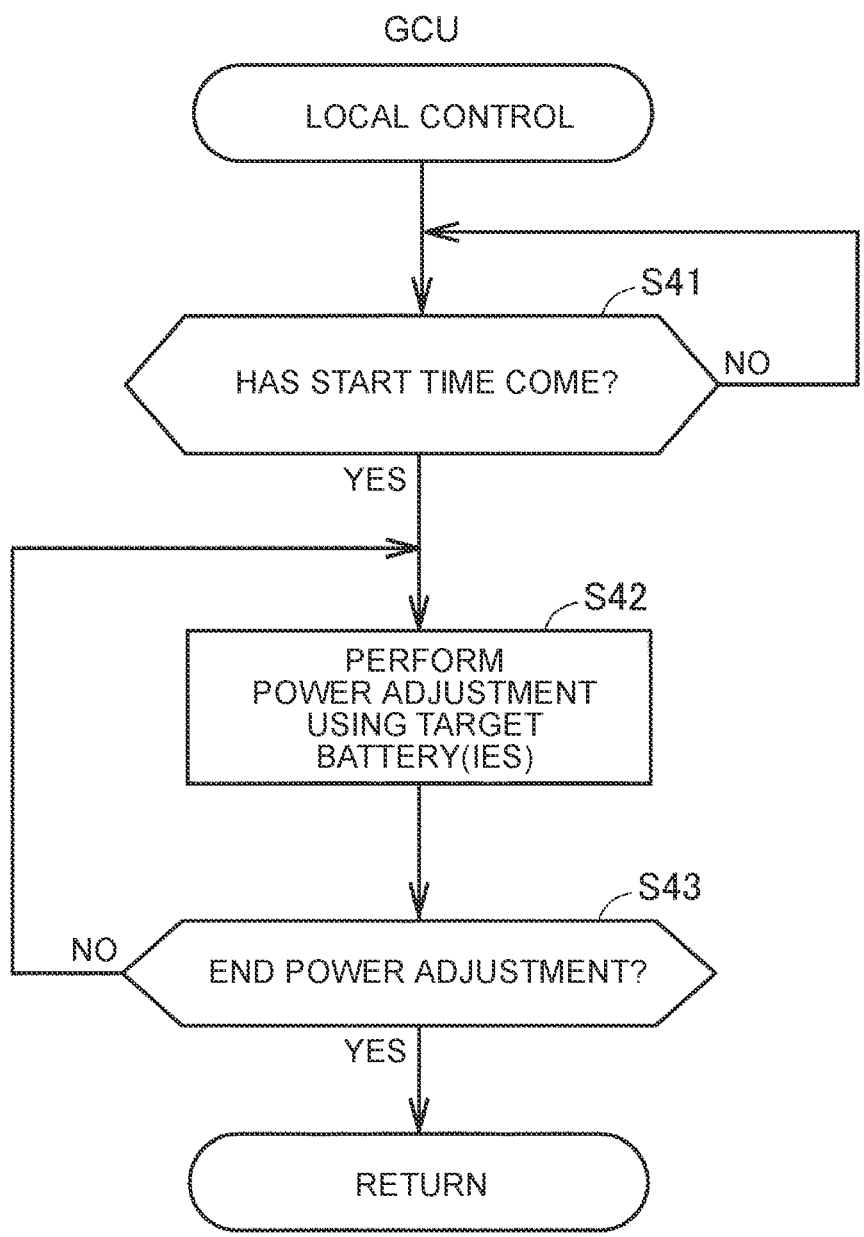
FIG. 16 is a flowchart showing details of a process related to power adjustment that is performed by local control shown in FIG. 13.

When the GCU 100 determines in S22 that the control method for the requested power adjustment is local control, the GCU 100 performs power adjustment by local control in S24. FIG. 16 is a flowchart showing details of S24 (power adjustment by local control).

Referring to FIG. 16 together with FIGS. 1 and 2, the GCU 100 waits in S41 until the start time of the local control (adjustment start time) comes. When the start time of the local control comes (YES in S41), the routine proceeds to S42. In S42, the GCU 100 performs power adjustment (more specifically, frequency control) for the power grid PG (i.e., adjustment of power of the power grid PG) using the one or more target batteries (S104 in FIG. 14). The GCU 100 causes the one or more target batteries to function as a primary control reserve by the local control. Specifically, the GCU 100 performs input and output control for the one or more target batteries so as to stabilize the frequency of the power grid PG while checking the detected values of the power sensors C1a, C1b, and C1c. With the batteries B other than the one or more target batteries being disconnected from the circuit, the GCU 100 causes the one or more target batteries to receive or output power according to the requested power adjustment in order to reduce frequency fluctuations of the power grid PG. The requested power adjustment for the power grid PG (i.e., the requested adjustment of power of the power grid PG) is thus performed.

When the power adjustment by the local control is performed in S42, the routine proceeds to S43. In S43, the GCU 100 determines whether a power adjustment end condition is satisfied. The power adjustment end condition is satisfied when the adjustment end time comes. The power adjustment end condition may also be satisfied when the GCU 100 receives an end notification from the server 200. The power adjustment by the local control (S42) is continued while the power adjustment end condition is not satisfied (NO in S43). When the power adjustment end condition is satisfied (YES in S43), the series of steps shown in FIG. 16 ends, and the process proceeds to S25 in FIG. 13.

Figure 17:
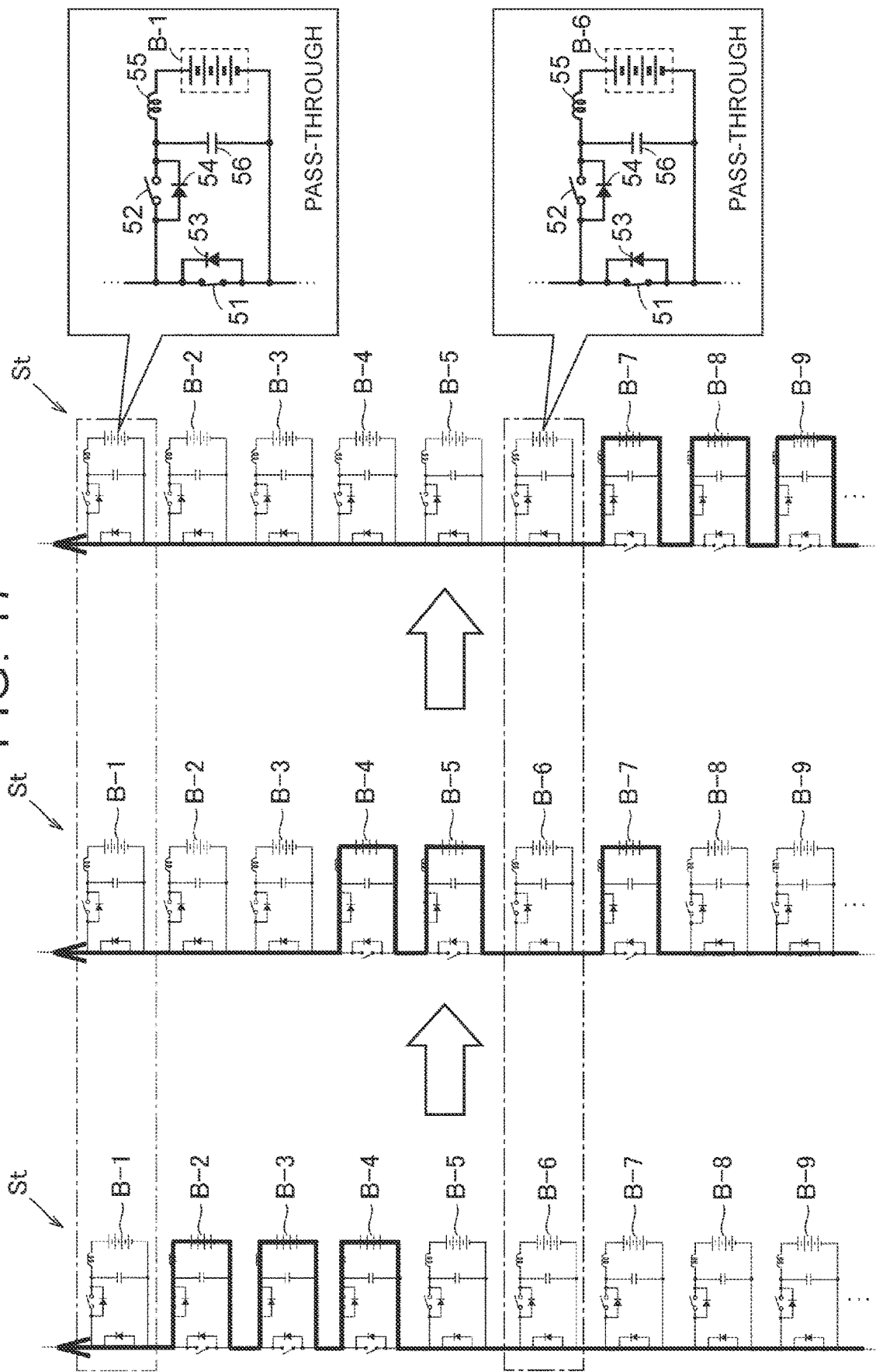
FIG. 17 shows an example of the state of each battery while power adjustment shown in FIG. 13 is being performed by sweep control.

FIG. 17 shows an example of the state of each battery while power adjustment is being performed by the sweep control (S32 in FIG. 15 or S42 in FIG. 16). Referring to FIG. 17, in this example, batteries B-2 to B-5 and B-7 to B-9 are target batteries, and batteries B-1, B-6 are batteries other than the target batteries. As shown in FIG. 17, the batteries B-1, B-6 are kept in the pass-through state while the power adjustment is being performed by the sweep control.

Referring back to FIG. 13 with FIGS. 1 and 2, the GCU 100 cancels disconnection of the batteries in S25. The batteries B disconnected from the circuit in S105 can thus be reconnected to the circuit. The GCU 100 reconnects the disconnected batteries B to the circuit, as necessary. For example, the battery (or batteries) (diagnostic target(s)) excluded from the candidate target batteries in S103 is (are) reconnected to the circuit in S25. Accordingly, the GCU 100 determines YES in S14 of FIG. 10 or FIG. 11, and resumes the degradation diagnosis. The series of steps shown in FIG. 13 ends when S25 is performed.

As described above, the power supply system 1 according to the present embodiment is configured to output AC power to an object (electrical wires PGL) to which power is to be supplied. The power supply system 1 includes the first power supply circuit 2, the second power supply circuit 3, and the GCU 100 (control device). The first power supply circuit 2 includes the DC battery strings for DC power (battery strings St1, St2, and St3), and the inverters (inverters 11, 21, and 31) that convert DC power output from the DC battery strings to AC power. The first power supply circuit 2 is configured to output the first AC power using the DC battery strings and the inverters. The second power supply circuit 3 includes the AC battery strings for AC power (battery strings St4 to St9), and is configured to output the second AC power using the AC battery strings.

The GCU 100 is configured to control the first power supply circuit 2 and the second power supply circuit 3. Each of the AC battery strings and the DC battery strings includes multiple battery circuit modules M connected in series. Each of the battery circuit modules M includes: the battery B; the output terminals OT1, OT2 that output the voltage of the battery B; the first switch (SW 51) connected to the output terminals OT1, OT2 and connected in parallel with the battery B; and the second switch (SW 52) connected in series with the battery B. Each of the battery circuit modules M is configured such that the voltage of the battery B is applied between the output terminals OT1, OT2 when the first switch is in the electrically disconnected state and the second switch is in the electrically connected state (see FIG. 2). The GCU 100 is configured to select one or more target batteries that are to perform requested energy management from the batteries included in the AC battery strings and the DC battery strings (S104 in FIG. 14), and perform the requested energy management using the one or more target batteries, with the batteries other than the one or more target batteries being disconnected from the circuit (S32 in FIG. 15 or S42 in FIG. 16).

With the above configuration, energy management can be suitably performed using the one or more target batteries while maintaining the state of the batteries that do not perform the energy management (batteries included in the battery strings other than the one or more target batteries).

In the above embodiment, the power density of each of the batteries included in the DC battery strings is higher than the power density of each of the batteries included in the AC battery strings. The energy density of each of the batteries included in the AC battery strings is higher than the energy density of each of the batteries included in the DC battery strings. Since high capacity batteries are used for low-rate power supply or charging, the power supply system 1 according to the present embodiment can more easily perform long-term power supply or charging. Moreover, since high power batteries and high capacity batteries are used for high-rate power supply or charging, the power supply system 1 according to the present embodiment can more suitably perform long-term power supply or charging. Combining the high capacity batteries and the high power batteries reduces the required number of batteries and reduces battery cost as compared to a case where the same power supply capability or the same charging capability is provided with the high-capacity batteries alone.

An energy management method according to the present embodiment includes: determining whether power fluctuations in requested energy management are large (S101 and S102 in FIG. 14); when it is determined that the power fluctuations in the requested energy management are not large (YES in S101 or NO in S102 in FIG. 14), selecting all the batteries included in the battery string as candidate target batteries (skipping S103 in FIG. 14), and when it is determined that the power fluctuations in the requested energy management are large (NO in S101 and YES in S102 in FIG. 14), selecting the batteries included in the battery string other than one or more batteries that are being subjected to the degradation diagnosis, as candidate target batteries (S103 in FIG. 14); selecting one or more target batteries from the candidate target batteries (S104 in FIG. 14); controlling the first and second switches (SWs 51, 52) so as to disconnect, from the circuit, the batteries included in the battery string other than the one or more target batteries (S105 in FIG. 14); and performing the requested energy management using the one or more target batteries (S32 in FIG. 15 or S42 in FIG. 16) with the batteries other than the one or more target batteries being disconnected from the circuit.

In the above energy management method, when the power fluctuations in the requested energy management are not large (acceptable for the degradation diagnosis), the energy management is performed in parallel with the degradation diagnosis. On the other hand, when the power fluctuations in the requested energy management are large (not acceptable for the degradation diagnosis), the one or more batteries that are being subjected to the degradation diagnosis are disconnected from the circuit, and the degradation diagnosis is interrupted. At this time, the state of the one or more batteries that are being subjected to the degradation diagnosis is maintained. Accordingly, the interrupted degradation diagnosis can be resumed after the energy management ends. This reduces the possibility that the degradation diagnosis may be started over.

In the above embodiment, the GCU 100 determines whether the power fluctuations in the requested energy management are acceptable for the degradation diagnosis, based on the response time and the duration time of the requested energy management (see FIG. 14). However, the present disclosure is not limited to this, and the GCU 100 may determine whether the power fluctuations in the requested energy management power are acceptable for the degradation diagnosis, based only on either the response time or the duration time of the requested energy management. For example, S101 or S102 may be omitted from the process shown in FIG. 14. The GCU 100 may determine whether the power fluctuations in the requested energy management are acceptable for the degradation diagnosis, based on the command intervals of the requested energy management. As the command intervals of the energy management are longer, the power fluctuations in the energy management are more likely to be acceptable for the degradation diagnosis. The GCU 100 may determine that the power fluctuations in the requested energy management are acceptable for the degradation diagnosis when the command intervals of the requested energy management are equal to or greater than a third reference value (e.g., 10 minutes).

The kinds of energy management (power adjustment) are not limited to the kinds shown in FIG. 12. For example, the power supply system 1 may be requested to perform energy management the user has won in a power market (electricity market) whose framework differs from country to country. Examples of the power market include a capacity market, a day-ahead market (spot market), an intraday market, a balancing market, and a real-time market.

In the above embodiment, one of the first output, the second output, the both outputs, the first input, the second input, and the both inputs is performed in energy management. However, the present disclosure is not limited to this, and the power supply system 1 may be configured to perform one of the first output, the second output, the both outputs, the first input, the second input, and the both inputs in response to a request from the user. The power supply system 1 may supply power to the building 300 in the event of a power outage of the power grid PG.

The building 300 may be equipped with power generation equipment (e.g., variable renewable energy source such as solar power generation equipment or wind power generation equipment). The power supply system 1 may be configured to store surplus power generated by the power generation equipment in a predetermined battery string. The power supply system 1 may be configured to output power from a predetermined battery string to the building 300 in response to a request from the building 300.

The embodiment disclosed herein should be considered to be illustrative and not restrictive in all respects. The scope of the present disclosure is shown by the scope of claims rather than the above description of the embodiment, and is intended to include all modifications within the meaning and scope equivalent to the scope of claims.

What is claimed is:

1. A power supply system comprising:
   a first power supply circuit including a direct-current battery string for direct-current power and an inverter that converts direct-current power output from the direct-current battery string to alternating-current power, the first power supply circuit being configured to output first alternating-current power with use of the direct-current battery string and the inverter;
   a second power supply circuit including an alternating-current battery string for alternating-current power, the second power supply circuit being configured to output second alternating-current power with use of the alternating-current battery string; and
   a control device configured to control the first power supply circuit and the second power supply circuit, wherein:
   each of the alternating-current battery string and the direct-current battery string includes multiple battery circuit modules connected in series, each of the battery circuit modules includes
   a battery,
   an output terminal that outputs a voltage of the battery,
   a first switch connected to the output terminal and connected in parallel with the battery, and
   a second switch connected in series with the battery;
   each of the battery circuit modules is configured such that the voltage of the battery is applied to the output terminal when the first switch is in an electrically disconnected state and the second switch is in an electrically connected state; and
   the control device is configured to select one or more target batteries that are to perform requested energy management from the batteries included in the alternating-current battery string and the direct-current battery string, and perform the requested energy management using the one or more target batteries with the batteries other than the one or more target batteries being disconnected from a circuit.

2. The power supply system according to claim 1, wherein:
   the control device is configured to perform a degradation diagnosis on each of one or more of the batteries included in the alternating-current battery string and one or more of the batteries included in the direct-current battery string using data continuously acquired during at least one of charging and discharging of the battery;
   the control device is configured to determine whether power fluctuations in the requested energy management are acceptable for the degradation diagnosis; and
   the control device is configured to exclude, from one or more candidate target batteries, one or more batteries that are being subjected to the degradation diagnosis among the batteries included in the alternating-current battery string and the direct-current battery string, when the control device determines that the power fluctuations in the requested energy management are not acceptable for the degradation diagnosis.

3. The power supply system according to claim 2, wherein the control device is configured to determine that the power fluctuations in the requested energy management are acceptable for the degradation diagnosis when a duration time of the requested energy management is equal to or greater than a first reference value.

4. The power supply system according to claim 2, wherein the control device is configured to determine that the power fluctuations in the requested energy management are not acceptable for the degradation diagnosis when a response time of the requested energy management is equal to or less than a second reference value.

5. The power supply system according to claim 1, wherein:
   a power density of each of the batteries included in the direct-current battery string is higher than a power density of each of the batteries included in the alternating-current battery string; and
   an energy density of each of the batteries included in the alternating-current battery string is higher than an energy density of each of the batteries included in the direct-current battery string.

6. The power supply system according to claim 1, wherein:
   each of the first power supply circuit and the second power supply circuit is electrically connected to an electrical wire connecting a building and an external power supply that supplies power to the building; and
   the requested energy management is adjustment of power of the external power supply.

7. The power supply system according to claim 6, further comprising an insulation filter located between the first power supply circuit and the electrical wire, wherein the inverter is a reused product that was used for another purpose.

8. The power supply system according to claim 1, wherein:
   the first power supply circuit includes a first drive circuit configured to drive the first switch and the second switch included in the direct-current battery string, and a first control circuit configured to send a signal for driving each of the first switch and the second switch to the first drive circuit according to a command from the control device; and
   the second power supply circuit includes a second drive circuit configured to drive the first switch and the second switch included in the alternating-current battery string, and a second control circuit configured to send a signal for driving each of the first switch and the second switch to the second drive circuit according to a command from the control device.

9. The power supply system according to claim 8, wherein:
   the inverter is a three-phase inverter;
   the control device is configured to send a command for controlling the direct-current battery string to the first control circuit and control the inverter such that three-phase alternating-current power is output from the first power supply circuit;
   the alternating-current battery string includes a U-phase battery string, a V-phase battery string, and a W-phase battery string that are Y-connected; and
   the control device is configured to send a command for controlling the U-phase battery string, the V-phase battery string, and the W-phase battery string to the second control circuit such that three-phase alternating-current power is output from the second power supply circuit.

10. A power supply system comprising:
a battery string; and
a control device configured to control the battery string, wherein:
the battery string includes multiple battery circuit modules connected in series;
each of the battery circuit modules includes
a battery,
an output terminal that outputs a voltage of the battery,
a first switch connected to the output terminal and connected in parallel with the battery, and
a second switch connected in series with the battery;
each of the battery circuit modules is configured such that the voltage of the battery is applied to the output terminal when the first switch is in an electrically disconnected state and the second switch is in an electrically connected state;
the control device is configured to select one or more target batteries that match requested energy management from the batteries included in the battery string, and perform the requested energy management using the one or more target batteries with the batteries other than the one or more target batteries being disconnected from a circuit;
the control device is configured to perform a degradation diagnosis on each of the batteries included in the battery string using data continuously acquired during at least one of charging and discharging of the battery;
the control device is configured to determine whether power fluctuations in the requested energy management are acceptable for the degradation diagnosis; and
the control device is configured to exclude, from one or more candidate target batteries, one or more batteries that are being subjected to the degradation diagnosis among the batteries included in the battery string, when the control device determines that the power fluctuations in the requested energy management are not acceptable for the degradation diagnosis.

11. A method for performing energy management using a battery string,
the battery string including multiple battery circuit modules connected in series,
each of the battery circuit modules including
a battery,
an output terminal that outputs a voltage of the battery,
a first switch connected to the output terminal and connected in parallel with the battery, and
a second switch connected in series with the battery, and
each of the battery circuit modules being configured such that the voltage of the battery is applied to the output terminal when the first switch is in an electrically disconnected state and the second switch is in an electrically connected state, the method comprising:
determining whether power fluctuations in requested energy management are acceptable for a degradation diagnosis;
when a determination is made that the power fluctuations in the requested energy management are not acceptable for the degradation diagnosis, selecting the batteries included in the battery string as candidate target batteries, and when a determination is made that the power fluctuations in the requested energy management are acceptable for the degradation diagnosis, selecting the batteries included in the battery string other than one or more batteries that are subjected to the degradation diagnosis, as the candidate target batteries;
selecting one or more target batteries from the candidate target batteries;
controlling the first and second switches so as to disconnect, from a circuit, the batteries included in the battery string other than the one or more target batteries; and
performing the requested energy management using the one or more target batteries, with the batteries other than the one or more target batteries being disconnected from the circuit.

12. The method according to claim 11, wherein:
the power fluctuations in the requested energy management are determined to be acceptable for the degradation diagnosis when a duration time of the requested energy management is equal to or greater than a first reference value;
the power fluctuations in the requested energy management are determined to be not acceptable for the degradation diagnosis when (i) the duration time of the requested energy management is not equal to or greater than the first reference value and (ii) a response time of the requested energy management is equal to or less than a second reference value; and
the power fluctuations in the requested energy management are determined to be acceptable for the degradation diagnosis when (i) the duration time of the requested energy management is not equal to or greater than the first reference value and (ii) the response time of the requested energy management is not equal to or less than the second reference value.

* * * * *